US009243756B2

(12) United States Patent
Davidson et al.

(10) Patent No.: US 9,243,756 B2
(45) Date of Patent: Jan. 26, 2016

(54) CAPACITIVE USER INTERFACE FOR A FAUCET AND METHOD OF FORMING

(71) Applicant: Masco Corporation of Indiana, Indianapolis, IN (US)

(72) Inventors: Kyle R. Davidson, Noblesville, IN (US); Adam M. De Vries, Anderson, IN (US)

(73) Assignee: Delta Faucet Company, Indianapolis, IN (US)

( * ) Notice: Subject to any disclaimer, the term of this patent is extended or adjusted under 35 U.S.C. 154(b) by 8 days.

(21) Appl. No.: 13/758,722

(22) Filed: Feb. 4, 2013

(65) Prior Publication Data
US 2013/0146160 A1 Jun. 13, 2013

Related U.S. Application Data

(63) Continuation-in-part of application No. 12/255,358, filed on Oct. 21, 2008, now Pat. No. 8,365,757, which is a continuation-in-part of application No. 11/737,727, filed on Apr. 19, 2007, now Pat. No.
(Continued)

(51) Int. Cl.
| F17D 3/00 | (2006.01) |
| H05K 13/00 | (2006.01) |
| E03C 1/04 | (2006.01) |
| E03C 1/05 | (2006.01) |
| G05D 23/13 | (2006.01) |

(52) U.S. Cl.
CPC .............. *F17D 3/00* (2013.01); *E03C 1/0404* (2013.01); *E03C 1/055* (2013.01); *G05D 23/1393* (2013.01); *H05K 13/00* (2013.01); *Y10T 29/49117* (2015.01); *Y10T 137/8158* (2015.04)

(58) Field of Classification Search
CPC ....... E03C 1/057; E03C 1/055; F16K 19/006; F16K 31/02; G06F 3/044; G06F 2203/04103; H03K 17/962; H03K 17/9622
USPC .......... 137/801; 251/129.04; 4/623; 200/310, 200/600; 174/257
See application file for complete search history.

(56) References Cited

U.S. PATENT DOCUMENTS

| 2,337,321 A | 12/1943 | Freeman |
| 2,991,481 A | 7/1961 | Book |
| 3,081,594 A | 3/1963 | Atkins et al. |
| 3,151,340 A | 10/1964 | Teshima |

(Continued)

FOREIGN PATENT DOCUMENTS

| CA | 2492226 A1 | 7/2005 |
| DE | 3339849 | 5/1985 |

(Continued)

OTHER PUBLICATIONS

Camacho et al., Freescale Semiconductor, "Touch Pad System Using MC34940/MC33794 E-Field Sensors," Feb. 2006, 52 pgs.

(Continued)

*Primary Examiner* — Matthew W Jellett
(74) *Attorney, Agent, or Firm* — Faegre Baker Daniels LLP

(57) ABSTRACT

An electronic user interface for use with a water delivery device, such as a faucet. The user interface illustratively includes a plurality of bonded layers thermally formed into a multi-dimensional shape. The layers may include a conductive layer, a graphics layer, and a protective layer. A structural support may be molded to a rear of the conductive layer.

9 Claims, 10 Drawing Sheets

Related U.S. Application Data 8,162,236, said application No. 12/255,358 is a continuation-in-part of application No. 11/700,556, filed on Jan. 31, 2007, now Pat. No. 8,118,240.

(60) Provisional application No. 60/794,229, filed on Apr. 20, 2006, provisional application No. 61/705,969, filed on Sep. 26, 2012.

(56) References Cited

U.S. PATENT DOCUMENTS

| | | |
|---|---|---|
| 3,254,313 A | 5/1966 | Atkins et al. |
| 3,314,081 A | 4/1967 | Atkins et al. |
| 3,406,941 A | 10/1968 | Ichimori et al. |
| 3,588,038 A | 6/1971 | Tanaka |
| 3,651,989 A | 3/1972 | Westrich |
| 3,672,479 A | 6/1972 | Schwertfeger et al. |
| 3,685,541 A | 8/1972 | Braucksick et al. |
| 3,705,574 A | 12/1972 | Duncan |
| 3,756,456 A | 9/1973 | Georgi |
| 3,762,440 A | 10/1973 | Bryant |
| 3,799,171 A | 3/1974 | Patel |
| 3,987,819 A | 10/1976 | Scheuermann |
| 4,172,381 A | 10/1979 | Aigner |
| 4,185,336 A | 1/1980 | Young |
| 4,200,018 A | 4/1980 | Sekiwa |
| 4,201,518 A | 5/1980 | Stevenson |
| 4,280,530 A | 7/1981 | Yi |
| 4,331,292 A | 5/1982 | Zimmer |
| 4,337,388 A | 6/1982 | July |
| 4,353,056 A | 10/1982 | Tsikos |
| 4,359,186 A | 11/1982 | Kiendl |
| 4,406,313 A | 9/1983 | Bennett et al. |
| 4,406,398 A | 9/1983 | Perkins |
| 4,407,444 A | 10/1983 | Knebel et al. |
| 4,409,694 A | 10/1983 | Barrett et al. |
| 4,410,791 A | 10/1983 | Eastep |
| 4,420,811 A | 12/1983 | Tarnay et al. |
| 4,421,269 A | 12/1983 | Ts'ao |
| 4,424,767 A | 1/1984 | Wicke et al. |
| 4,429,422 A | 2/1984 | Wareham |
| 4,436,983 A | 3/1984 | Solobay |
| 4,439,669 A | 3/1984 | Ryffel |
| 4,450,829 A | 5/1984 | Morita et al. |
| 4,459,465 A | 7/1984 | Knight |
| 4,503,575 A | 3/1985 | Knoop et al. |
| 4,532,962 A | 8/1985 | Campau |
| 4,537,348 A | 8/1985 | Gossi |
| 4,541,562 A | 9/1985 | Zukausky |
| 4,554,688 A | 11/1985 | Puccerella |
| 4,563,780 A | 1/1986 | Pollack |
| 4,567,350 A | 1/1986 | Todd, Jr. |
| 4,581,707 A | 4/1986 | Millar |
| 4,584,463 A | 4/1986 | Klages et al. |
| 4,604,515 A | 8/1986 | Davidson |
| 4,604,764 A | 8/1986 | Enzo |
| 4,606,325 A | 8/1986 | Lujan |
| 4,611,757 A | 9/1986 | Saether |
| 4,628,902 A | 12/1986 | Comber |
| 4,638,147 A | 1/1987 | Dytch et al. |
| 4,674,678 A | 6/1987 | Knebel et al. |
| 4,680,446 A | 7/1987 | Post |
| 4,682,581 A | 7/1987 | Laing et al. |
| 4,682,728 A | 7/1987 | Oudenhoven et al. |
| 4,688,277 A | 8/1987 | Kakinoki et al. |
| 4,693,415 A | 9/1987 | Sturm |
| 4,700,884 A | 10/1987 | Barrett et al. |
| 4,700,885 A | 10/1987 | Knebel |
| 4,709,728 A | 12/1987 | Ying-Chung |
| 4,713,525 A | 12/1987 | Eastep |
| 4,735,357 A | 4/1988 | Gregory et al. |
| 4,738,280 A | 4/1988 | Oberholtzer |
| 4,742,456 A | 5/1988 | Kamena |
| 4,750,472 A | 6/1988 | Fazekas |
| 4,753,265 A | 6/1988 | Barrett et al. |
| 4,756,030 A | 7/1988 | Juliver |
| 4,757,943 A | 7/1988 | Sperling et al. |
| 4,762,273 A | 8/1988 | Gregory et al. |
| 4,768,705 A | 9/1988 | Tsutsui et al. |
| 4,786,782 A | 11/1988 | Takai et al. |
| 4,798,224 A | 1/1989 | Haws |
| 4,808,793 A | 2/1989 | Hurko |
| 4,832,259 A | 5/1989 | Vandermeyden |
| 4,845,316 A | 7/1989 | Kaercher |
| 4,854,498 A | 8/1989 | Stayton |
| 4,869,287 A | 9/1989 | Pepper |
| 4,869,427 A | 9/1989 | Kawamoto et al. |
| 4,870,986 A | 10/1989 | Barrett et al. |
| 4,872,485 A | 10/1989 | Laverty |
| 4,875,623 A | 10/1989 | Garris |
| 4,893,653 A | 1/1990 | Ferrigno |
| 4,896,658 A | 1/1990 | Yonekubo et al. |
| 4,901,915 A | 2/1990 | Sakakibara |
| 4,909,435 A | 3/1990 | Kidouchi et al. |
| 4,914,758 A | 4/1990 | Shaw |
| 4,916,613 A | 4/1990 | Lange et al. |
| 4,917,142 A | 4/1990 | Laing et al. |
| 4,923,116 A | 5/1990 | Homan |
| 4,930,551 A | 6/1990 | Haws |
| 4,936,289 A | 6/1990 | Peterson |
| 4,936,508 A | 6/1990 | Ingalz |
| 4,941,608 A | 7/1990 | Shimizu et al. |
| 4,945,942 A | 8/1990 | Lund |
| 4,945,943 A | 8/1990 | Cogger |
| 4,955,535 A | 9/1990 | Tsutsui et al. |
| 4,965,894 A | 10/1990 | Baus |
| 4,967,794 A | 11/1990 | Tsutsui et al. |
| 4,969,598 A | 11/1990 | Garris |
| 4,970,373 A | 11/1990 | Lutz et al. |
| 4,971,106 A | 11/1990 | Tsutsui et al. |
| 4,998,673 A | 3/1991 | Pilolla |
| 5,009,572 A | 4/1991 | Imhoff et al. |
| 5,020,127 A | 5/1991 | Eddas et al. |
| 5,033,508 A | 7/1991 | Laverty |
| 5,033,715 A | 7/1991 | Chiang |
| 5,040,106 A | 8/1991 | Maag |
| 5,042,524 A | 8/1991 | Lund |
| 5,056,712 A | 10/1991 | Enck |
| 5,057,214 A | 10/1991 | Morris |
| 5,058,804 A | 10/1991 | Yonchubo et al. |
| 5,063,955 A | 11/1991 | Sakakibara |
| 5,073,991 A | 12/1991 | Marty |
| 5,074,520 A | 12/1991 | Lee et al. |
| 5,086,526 A | 2/1992 | Van Marcke |
| 5,092,560 A | 3/1992 | Chen |
| 5,095,945 A | 3/1992 | Jensen |
| 5,105,846 A | 4/1992 | Britt |
| 5,124,934 A | 6/1992 | Kawamoto et al. |
| 5,125,433 A | 6/1992 | DeMoss et al. |
| 5,129,034 A | 7/1992 | Sydenstricker |
| 5,133,089 A | 7/1992 | Tsutsui et al. |
| 5,139,044 A | 8/1992 | Otten et al. |
| 5,143,049 A | 9/1992 | Laing et al. |
| 5,148,824 A | 9/1992 | Wilson et al. |
| 5,170,361 A | 12/1992 | Reed |
| 5,170,514 A | 12/1992 | Weigert |
| 5,170,816 A | 12/1992 | Schnieders |
| 5,170,944 A | 12/1992 | Shirai |
| 5,174,495 A | 12/1992 | Eichholz et al. |
| 5,175,892 A | 1/1993 | Shaw |
| 5,183,029 A | 2/1993 | Ranger |
| 5,184,642 A | 2/1993 | Powell |
| 5,187,816 A | 2/1993 | Chiou |
| 5,202,666 A | 4/1993 | Knippscheer |
| 5,205,318 A | 4/1993 | Massaro et al. |
| 5,206,963 A | 5/1993 | Wiens |
| 5,217,035 A | 6/1993 | Van Marcke |
| 5,220,488 A | 6/1993 | Denes |
| 5,224,509 A | 7/1993 | Tanaka et al. |
| 5,224,685 A | 7/1993 | Chiang et al. |
| 5,226,629 A | 7/1993 | Millman et al. |
| 5,243,717 A | 9/1993 | Yasuo |
| D340,279 S | 10/1993 | Mattis |
| 5,257,341 A | 10/1993 | Austin et al. |

(56) References Cited

U.S. PATENT DOCUMENTS

| | | |
|---|---|---|
| 5,261,443 A | 11/1993 | Walsh |
| 5,262,621 A | 11/1993 | Hu et al. |
| 5,265,318 A | 11/1993 | Shero |
| 5,277,219 A | 1/1994 | Lund |
| 5,287,570 A | 2/1994 | Peterson et al. |
| 5,315,719 A | 5/1994 | Tsutsui et al. |
| 5,323,803 A | 6/1994 | Blumenauer |
| 5,325,822 A | 7/1994 | Fernandez |
| 5,334,819 A | 8/1994 | Lin |
| 5,341,839 A | 8/1994 | Kobayashi et al. |
| 5,351,712 A | 10/1994 | Houlihan |
| 5,358,177 A | 10/1994 | Cashmore |
| 5,361,215 A | 11/1994 | Tompkins et al. |
| 5,362,026 A | 11/1994 | Kobayashi et al. |
| 5,385,168 A | 1/1995 | Lund |
| 5,400,961 A | 3/1995 | Tsutsui et al. |
| 5,408,578 A | 4/1995 | Bolivar |
| 5,409,037 A | 4/1995 | Wheeler et al. |
| 5,419,930 A | 5/1995 | Schucker |
| 5,429,272 A | 7/1995 | Luigi |
| 5,431,302 A | 7/1995 | Tulley et al. |
| 5,433,342 A | 7/1995 | Luro |
| 5,437,003 A | 7/1995 | Blanco |
| RE35,018 E | 8/1995 | Homan |
| 5,438,642 A | 8/1995 | Posen |
| 5,467,967 A | 11/1995 | Gillooly |
| 5,479,558 A | 12/1995 | White et al. |
| 5,482,250 A | 1/1996 | Kodaira |
| 5,504,306 A | 4/1996 | Russell et al. |
| 5,504,950 A | 4/1996 | Natalizia et al. |
| 5,511,579 A | 4/1996 | Price |
| 5,511,723 A | 4/1996 | Eki et al. |
| 5,540,555 A | 7/1996 | Corso et al. |
| 5,550,753 A | 8/1996 | Tompkins et al. |
| 5,555,912 A | 9/1996 | Saadi et al. |
| 5,564,462 A | 10/1996 | Storch |
| 5,566,702 A | 10/1996 | Philipp |
| 5,570,869 A | 11/1996 | Diaz et al. |
| 5,572,985 A | 11/1996 | Benham |
| 5,575,424 A | 11/1996 | Fleischmann |
| 5,577,660 A | 11/1996 | Hansen |
| 5,584,316 A | 12/1996 | Lund |
| 5,586,572 A | 12/1996 | Lund |
| 5,588,636 A | 12/1996 | Eichholz et al. |
| 5,595,342 A | 1/1997 | McNair et al. |
| 5,603,344 A | 2/1997 | Hall |
| 5,610,589 A | 3/1997 | Evans et al. |
| 5,622,203 A | 4/1997 | Givler et al. |
| 5,623,990 A | 4/1997 | Pirkle |
| 5,627,375 A | 5/1997 | Hsieh |
| 5,634,220 A | 6/1997 | Chiu |
| 5,682,032 A | 10/1997 | Philipp |
| 5,694,653 A | 12/1997 | Harald |
| 5,730,165 A | 3/1998 | Philipp |
| 5,735,291 A | 4/1998 | Kaonohi |
| 5,758,688 A | 6/1998 | Hamanaka et al. |
| 5,769,120 A | 6/1998 | Laverty et al. |
| 5,775,372 A | 7/1998 | Houlihan |
| 5,784,531 A | 7/1998 | Mann et al. |
| 5,790,024 A | 8/1998 | Ripingill et al. |
| 5,812,059 A | 9/1998 | Shaw et al. |
| 5,813,655 A | 9/1998 | Pinchott et al. |
| 5,819,366 A | 10/1998 | Edin |
| 5,823,229 A | 10/1998 | Bertrand et al. |
| 5,829,467 A | 11/1998 | Spicher |
| 5,829,475 A | 11/1998 | Acker |
| 5,845,844 A | 12/1998 | Zosimodis |
| 5,853,130 A | 12/1998 | Ellsworth |
| 5,855,356 A | 1/1999 | Fait |
| 5,857,717 A | 1/1999 | Caffrey |
| 5,868,311 A | 2/1999 | Cretu-Petra |
| 5,872,891 A | 2/1999 | Son |
| 5,893,387 A | 4/1999 | Paterson et al. |
| 5,918,855 A | 7/1999 | Hamanaka et al. |
| 5,934,325 A | 8/1999 | Brattoli et al. |
| 5,941,275 A | 8/1999 | Laing |
| 5,942,514 A | 8/1999 | Barker |
| 5,942,733 A | 8/1999 | Allen et al. |
| 5,944,221 A | 8/1999 | Laing et al. |
| 5,961,095 A | 10/1999 | Schrott |
| 5,963,624 A | 10/1999 | Pope |
| 5,966,753 A | 10/1999 | Gauthier et al. |
| 5,979,776 A | 11/1999 | Williams |
| 5,983,922 A | 11/1999 | Laing et al. |
| 6,000,170 A | 12/1999 | Davis |
| 6,003,170 A | 12/1999 | Humpert et al. |
| 6,003,182 A | 12/1999 | Song |
| 6,006,784 A | 12/1999 | Tsutsui et al. |
| 6,019,130 A | 2/2000 | Rump |
| 6,026,844 A | 2/2000 | Laing et al. |
| 6,029,094 A | 2/2000 | Diffut |
| 6,032,616 A | 3/2000 | Jones |
| 6,042,885 A | 3/2000 | Woollard et al. |
| 6,059,192 A | 5/2000 | Zosimadis |
| 6,061,499 A | 5/2000 | Hlebovy |
| 6,075,454 A | 6/2000 | Yamasaki |
| 6,082,407 A | 7/2000 | Paterson et al. |
| 6,093,313 A | 7/2000 | Bovaird et al. |
| 6,101,452 A | 8/2000 | Krall et al. |
| 6,132,085 A | 10/2000 | Bergeron |
| 6,167,845 B1 | 1/2001 | Decker, Sr. |
| 6,175,689 B1 | 1/2001 | Blanco, Jr. |
| 6,182,683 B1 | 2/2001 | Sisk |
| 6,192,192 B1 | 2/2001 | Illy et al. |
| 6,196,065 B1 | 3/2001 | Henksmeier et al. |
| 6,202,980 B1 | 3/2001 | Vincent et al. |
| 6,220,297 B1 | 4/2001 | Marty et al. |
| 6,227,235 B1 | 5/2001 | Laing et al. |
| 6,240,250 B1 | 5/2001 | Blanco, Jr. |
| 6,250,558 B1 | 6/2001 | Dogre Cuevas |
| 6,250,601 B1 | 6/2001 | Kolar et al. |
| 6,273,394 B1 | 8/2001 | Vincent et al. |
| 6,283,139 B1 | 9/2001 | Symonds et al. |
| 6,286,764 B1 | 9/2001 | Garvey et al. |
| 6,288,707 B1 | 9/2001 | Philipp |
| 6,290,139 B1 | 9/2001 | Kolze |
| 6,290,147 B1 | 9/2001 | Bertrand et al. |
| 6,294,786 B1 | 9/2001 | Marcichow et al. |
| 6,305,075 B1 | 10/2001 | Ersoy et al. |
| 6,315,208 B1 | 11/2001 | Doyle |
| 6,317,717 B1 | 11/2001 | Lindsey et al. |
| 6,321,785 B1 | 11/2001 | Bergmann |
| 6,337,635 B1 | 1/2002 | Ericksen et al. |
| 6,340,032 B1 | 1/2002 | Zosimadis |
| 6,341,389 B2 | 1/2002 | Philipps-Liebich et al. |
| 6,351,603 B2 | 2/2002 | Waithe et al. |
| 6,363,549 B2 | 4/2002 | Humpert et al. |
| 6,370,965 B1 | 4/2002 | Knapp |
| 6,377,009 B1 | 4/2002 | Philipp |
| 6,381,770 B1 | 5/2002 | Raisch |
| 6,382,030 B1 | 5/2002 | Kihara et al. |
| 6,389,226 B1 | 5/2002 | Neale et al. |
| 6,438,770 B1 | 8/2002 | Hed et al. |
| 6,445,306 B1 | 9/2002 | Trovato et al. |
| 6,446,875 B1 | 9/2002 | Brooks et al. |
| 6,452,514 B1 | 9/2002 | Philipp |
| RE37,888 E | 10/2002 | Cretu-Petra |
| 6,457,355 B1 | 10/2002 | Philipp |
| 6,466,036 B1 | 10/2002 | Philipp |
| 6,473,917 B1 | 11/2002 | Mateina |
| 6,474,951 B2 | 11/2002 | Stephan et al. |
| 6,513,787 B1 | 2/2003 | Jeromson et al. |
| 6,522,078 B1 | 2/2003 | Okamoto et al. |
| 6,535,200 B2 | 3/2003 | Philipp |
| 6,536,464 B1 | 3/2003 | Lum et al. |
| 6,549,816 B2 | 4/2003 | Gauthier et al. |
| 6,574,426 B1 | 6/2003 | Blanco, Jr. |
| 6,588,377 B1 | 7/2003 | Leary et al. |
| 6,588,453 B2 | 7/2003 | Marty et al. |
| 6,598,245 B2 | 7/2003 | Nishioka |
| 6,612,267 B1 | 9/2003 | West |
| 6,619,320 B2 | 9/2003 | Parsons |
| 6,622,930 B2 | 9/2003 | Laing et al. |
| 6,629,645 B2 | 10/2003 | Mountford et al. |

(56) References Cited

U.S. PATENT DOCUMENTS

| | | |
|---|---|---|
| 6,639,209 B1 | 10/2003 | Patterson et al. |
| 6,644,333 B2 | 11/2003 | Gloodt |
| 6,659,048 B1 | 12/2003 | DeSantis et al. |
| 6,661,410 B2 * | 12/2003 | Casebolt et al. ............... 345/173 |
| 6,676,024 B1 | 1/2004 | McNerney et al. |
| 6,684,822 B1 | 2/2004 | Lieggi |
| 6,691,338 B2 | 2/2004 | Zieger |
| 6,705,534 B1 | 3/2004 | Mueller |
| 6,707,030 B1 | 3/2004 | Watson |
| 6,734,685 B2 | 5/2004 | Rudrich |
| 6,738,996 B1 | 5/2004 | Malek et al. |
| 6,757,921 B2 | 7/2004 | Esche |
| 6,768,103 B2 | 7/2004 | Watson |
| 6,770,869 B2 | 8/2004 | Patterson et al. |
| 6,779,552 B1 | 8/2004 | Coffman |
| 6,805,458 B2 | 10/2004 | Schindler et al. |
| 6,845,526 B2 | 1/2005 | Malek et al. |
| 6,877,172 B2 | 4/2005 | Malek et al. |
| 6,892,952 B2 | 5/2005 | Chang et al. |
| 6,895,985 B2 | 5/2005 | Popper et al. |
| 6,913,203 B2 | 7/2005 | DeLangis |
| 6,955,333 B2 | 10/2005 | Patterson et al. |
| 6,956,498 B1 | 10/2005 | Gauthier et al. |
| 6,962,162 B2 | 11/2005 | Acker |
| 6,962,168 B2 | 11/2005 | McDaniel et al. |
| 6,964,404 B2 | 11/2005 | Patterson et al. |
| 6,964,405 B2 | 11/2005 | Marcichow et al. |
| 6,968,860 B1 | 11/2005 | Haenlein et al. |
| 6,993,607 B2 | 1/2006 | Phillipp |
| 7,025,077 B2 | 4/2006 | Vogel |
| 7,049,536 B1 * | 5/2006 | Marcus et al. ................. 200/310 |
| 7,069,941 B2 | 7/2006 | Parsons et al. |
| 7,096,517 B2 | 8/2006 | Gubeli et al. |
| 7,099,649 B2 | 8/2006 | Patterson et al. |
| D528,991 S | 9/2006 | Katsuyama |
| 7,150,293 B2 | 12/2006 | Jonte |
| 7,174,577 B2 | 2/2007 | Jost et al. |
| 7,228,874 B2 | 6/2007 | Bolderheij et al. |
| 7,232,111 B2 | 6/2007 | McDaniel et al. |
| 7,295,190 B2 | 11/2007 | Philipp |
| 7,486,280 B2 * | 2/2009 | Iandoli et al. ................. 345/173 |
| 7,518,381 B2 | 4/2009 | Lamborghini et al. |
| 7,537,195 B2 | 5/2009 | McDaniel et al. |
| 7,690,395 B2 | 4/2010 | Jonte et al. |
| 8,089,473 B2 | 1/2012 | Koottungal |
| 8,118,240 B2 | 2/2012 | Rodenbeck et al. |
| 8,162,236 B2 | 4/2012 | Rodenbeck et al. |
| 8,198,979 B2 | 6/2012 | Haag et al. |
| 8,243,040 B2 | 8/2012 | Koottungal |
| 8,267,328 B2 * | 9/2012 | Pohl et al. ................... 236/12.12 |
| 8,365,767 B2 | 2/2013 | Davidson et al. |
| 2001/0022352 A1 | 9/2001 | Rudrich |
| 2001/0044954 A1 | 11/2001 | DiCarlo |
| 2002/0007510 A1 | 1/2002 | Mann |
| 2002/0015024 A1 | 2/2002 | Westerman et al. |
| 2002/0113134 A1 | 8/2002 | Laing et al. |
| 2002/0117122 A1 | 8/2002 | Lindner |
| 2002/0148040 A1 | 10/2002 | Mateina |
| 2002/0179723 A1 | 12/2002 | Wack et al. |
| 2003/0001025 A1 | 1/2003 | Quintana |
| 2003/0080194 A1 | 5/2003 | O'Hara et al. |
| 2003/0088338 A1 | 5/2003 | Phillips et al. |
| 2003/0089399 A1 | 5/2003 | Acker |
| 2003/0125842 A1 | 7/2003 | Chang et al. |
| 2003/0126993 A1 | 7/2003 | Lassota et al. |
| 2003/0185548 A1 | 10/2003 | Novotny et al. |
| 2003/0189108 A1 | 10/2003 | Bosio |
| 2003/0201018 A1 | 10/2003 | Bush |
| 2003/0213062 A1 | 11/2003 | Honda et al. |
| 2003/0234769 A1 | 12/2003 | Cross et al. |
| 2004/0011399 A1 | 1/2004 | Sigien, Jr. |
| 2004/0041033 A1 | 3/2004 | Kemp |
| 2004/0041034 A1 | 3/2004 | Kemp |
| 2004/0061685 A1 | 4/2004 | Ostergard et al. |
| 2004/0088786 A1 | 5/2004 | Malek et al. |
| 2004/0135010 A1 | 7/2004 | Malek et al. |
| 2004/0144866 A1 | 7/2004 | Nelson et al. |
| 2004/0149643 A1 | 8/2004 | Vandenbelt et al. |
| 2004/0155116 A1 | 8/2004 | Wack et al. |
| 2004/0195382 A1 | 10/2004 | Anderson et al. |
| 2004/0204779 A1 | 10/2004 | Mueller et al. |
| 2004/0206405 A1 | 10/2004 | Smith et al. |
| 2004/0212599 A1 | 10/2004 | Cok et al. |
| 2004/0255375 A1 | 12/2004 | Scarlata |
| 2004/0262552 A1 | 12/2004 | Lowe |
| 2005/0001046 A1 | 1/2005 | Laing |
| 2005/0006402 A1 | 1/2005 | Acker |
| 2005/0022871 A1 | 2/2005 | Acker |
| 2005/0044625 A1 | 3/2005 | Kommers |
| 2005/0082503 A1 | 4/2005 | Patterson et al. |
| 2005/0086958 A1 | 4/2005 | Walsh |
| 2005/0117912 A1 | 6/2005 | Patterson et al. |
| 2005/0121529 A1 | 6/2005 | DeLangis |
| 2005/0125083 A1 | 6/2005 | Kiko |
| 2005/0127313 A1 | 6/2005 | Watson |
| 2005/0133100 A1 | 6/2005 | Bolderheij et al. |
| 2005/0146513 A1 | 7/2005 | Hill et al. |
| 2005/0150552 A1 | 7/2005 | Forshey |
| 2005/0150556 A1 | 7/2005 | Jonte |
| 2005/0151101 A1 | 7/2005 | McDaniel et al. |
| 2005/0167625 A1 | 8/2005 | Deen |
| 2005/0194399 A1 | 9/2005 | Proctor |
| 2005/0199841 A1 | 9/2005 | O'Maley |
| 2005/0199843 A1 | 9/2005 | Jost et al. |
| 2005/0236594 A1 | 10/2005 | Lilly et al. |
| 2005/0257628 A1 | 11/2005 | Nikaido et al. |
| 2005/0273218 A1 | 12/2005 | Breed et al. |
| 2006/0066991 A1 | 3/2006 | Hirano et al. |
| 2006/0101575 A1 | 5/2006 | Louis |
| 2006/0130907 A1 | 6/2006 | Marty et al. |
| 2006/0130908 A1 | 6/2006 | Marty et al. |
| 2006/0138246 A1 | 6/2006 | Stowe et al. |
| 2006/0153165 A1 | 7/2006 | Beachy |
| 2006/0186215 A1 | 8/2006 | Logan |
| 2006/0200903 A1 | 9/2006 | Rodenbeck et al. |
| 2006/0201558 A1 | 9/2006 | Marty et al. |
| 2006/0202142 A1 | 9/2006 | Marty et al. |
| 2006/0212016 A1 | 9/2006 | Lavon et al. |
| 2006/0214016 A1 | 9/2006 | Erdely et al. |
| 2006/0231638 A1 | 10/2006 | Belz et al. |
| 2006/0231788 A1 | 10/2006 | Cheng |
| 2006/0238428 A1 | 10/2006 | Schmitt et al. |
| 2006/0238513 A1 | 10/2006 | Philipp |
| 2006/0283511 A1 | 12/2006 | Nelson |
| 2007/0001018 A1 | 1/2007 | Schmitt et al. |
| 2007/0057215 A1 | 3/2007 | Parsons et al. |
| 2007/0069168 A1 | 3/2007 | Jonte |
| 2007/0069169 A1 | 3/2007 | Lin |
| 2007/0069418 A1 | 3/2007 | Liao et al. |
| 2007/0157978 A1 | 7/2007 | Jonte et al. |
| 2007/0170384 A1 | 7/2007 | Goodman |
| 2007/0235672 A1 | 10/2007 | McDaniel et al. |
| 2007/0241977 A1 | 10/2007 | Vance |
| 2007/0246267 A1 | 10/2007 | Koottungal |
| 2007/0246550 A1 | 10/2007 | Rodenbeck et al. |
| 2007/2046564 | 10/2007 | Rodenbeck et al. |
| 2007/0273394 A1 | 11/2007 | Tanner et al. |
| 2008/0178950 A1 | 7/2008 | Marty et al. |
| 2008/0178957 A1 | 7/2008 | Thomas et al. |
| 2008/0189850 A1 | 8/2008 | Seggio et al. |
| 2008/0203195 A1 | 8/2008 | Schmitt |
| 2008/0257706 A1 * | 10/2008 | Haag ............................ 200/600 |
| 2008/0271238 A1 | 11/2008 | Reeder et al. |
| 2009/0039176 A1 | 2/2009 | Davidson et al. |
| 2009/0056011 A1 | 3/2009 | Wolf et al. |
| 2009/0108985 A1 * | 4/2009 | Haag et al. .................... 338/248 |
| 2009/0119832 A1 * | 5/2009 | Conroy ............................ 4/623 |
| 2009/0277508 A1 * | 11/2009 | Pohl et al. ........................ 137/88 |
| 2010/0012194 A1 | 1/2010 | Jonte et al. |
| 2010/0065764 A1 | 3/2010 | Canpolat |
| 2010/0096017 A1 | 4/2010 | Jonte et al. |
| 2010/0117660 A1 | 5/2010 | Douglas et al. |
| 2010/0242274 A1 | 9/2010 | Rosenfeld et al. |
| 2010/0294641 A1 | 11/2010 | Kunkel |

(56) References Cited

U.S. PATENT DOCUMENTS

| | | | |
|---|---|---|---|
| 2011/0187957 A1 | 8/2011 | Kim et al. | |
| 2012/0188179 A1 | 7/2012 | Karlsson | |
| 2012/0200517 A1 | 8/2012 | Nikolovski | |
| 2012/0223805 A1 | 9/2012 | Haag et al. | |
| 2013/0239321 A1* | 9/2013 | Reeder et al. | 4/615 |
| 2013/0269786 A1* | 10/2013 | Song | 137/2 |

FOREIGN PATENT DOCUMENTS

| | | | |
|---|---|---|---|
| DE | 04401637 | | 5/1998 |
| DE | 19815324 | | 11/2000 |
| EP | 0961067 | B1 | 4/1999 |
| JP | 63111383 | | 10/1986 |
| JP | 00073426 | | 12/1998 |
| JP | 2003-20703 | A | 1/2003 |
| JP | 2003105817 | | 4/2003 |
| JP | 2003293411 | | 10/2003 |
| JP | 2004-092023 | | 3/2004 |
| JP | 2005-146551 | A | 6/2005 |
| KR | 10-1997-0700266 | | 1/1997 |
| KR | 10-2003-0008144 | | 1/2003 |
| KR | 10-2003-0077823 | | 10/2003 |
| KR | 20-0382786 | Y1 | 4/2005 |
| WO | WO 91/17377 | | 11/1991 |
| WO | WO 01/20204 | | 3/2001 |
| WO | WO 2004/001142 | | 12/2003 |
| WO | WO 2004/094990 | | 11/2004 |
| WO | WO 2005/057086 | | 6/2005 |
| WO | WO 2006/136256 | | 12/2006 |
| WO | WO 2007/059051 | | 5/2007 |
| WO | WO 2007/082301 | | 7/2007 |
| WO | WO 2008/094651 | | 8/2008 |
| WO | WO 2010/120070 | | 10/2010 |

OTHER PUBLICATIONS

Hego WaterDesign, "Touch Faucets—Amazing Futuristic Faucet Designs," Oct. 6, 2009, 3 pgs.
Quantum Research Group, "E401 User Manual," at least as early as Oct. 22, 2007, 15 pgs.
Quantum Research Group, "Gorenje Puts QSlideTM Technology into Next-Generation Kitchen Hob," Feb. 8, 2006, http://www.qprox.com/news/gorenje.php, 3 pgs.
Quantum Research Group, "QproxTM Capacitive Touch Applications," © 2005, http://www.qprox.com/background/applications.php, 8 pgs.
Quantum Research Group, "QT401 QSlide™ Touch Slider IC," 2004, 16 pgs.
Quantum Research Group, "QT411-ISSG QSlide™ Touch Slider IC," 2004-2005, 12 pgs.
Sequine et al., Cypress Perform, "Application Notes AN2292," Oct. 31, 2005, 15 pgs.
Sequine et al., Cypress Perform, "Application Notes AN2233a," Apr. 14, 2005, 6 pgs.
SLOAN® Optima® i.q. Electronic Hand Washing Faucet, Apr. 2004, 2 pgs.
Symmons, Ultra-Sense, Battery-Powered Faucets with PDS and Ultra-Sense AC Powered Faucets, © 1999-2004, 2 pgs.
Symmons®, "Ultra-Sense® Sensor Faucets with Position-Sensitive Detection," Aug. 2004, 4 pgs.
Symmons® Commercial Faucets: Reliability With a Sense of Style, at least as early as Jan. 4, 2006, 1 pg.
Symmons®, "Ultra-Sense® Battery-Powered, Sensor-Operated Lavatory Faucet S-6080 Series," Oct. 2002, 4 pgs.
Symmons®, "Ultra-Sense® Sensor Faucets with Position-Sensitive Detection," © 2001-2002, 2 pgs.
Technical Concepts International, Inc., Capri AutoFaucet® with Surround Sensor™ Technology, 500556, 500576, 500577, Aug. 2004, 1 pg.
Technical Concepts, AutoFaucet® with "Surround Sensor" Technology, Oct. 2005, 4 pgs.
TOTO® Products, "Self-Generating EcoPower System Sensor Faucet, Standard Spout," Specification Sheet, Nov. 2002, 2 pgs.
Various Products (available at least before Apr. 20, 2006), 5 pgs.
ZURN® Plumbing Products Group, "AquaSense® Sensor Faucet," Jun. 9, 2004, 2 pgs.
ZURN® Plumbing Products Group, "AquaSense® Z6903 Series", Installation, Operation, Maintenance and Parts Manual, Aug. 2001, 5 pgs.
Phillip, "Tough Touch Screen", appliance design, Feb. 2006, pp. 14-17.
KWC Armaturen, "Kitchen faucet," 802285 installation and service instructions, Jul. 2005, 8 pgs.
Dave Van Ess, Capacitive Sending Builds a Better Water-Cooler Control, Cypress Semiconductor Corp., Nov. 2007.
Aviation Faucet System, Product Brochure, Franke Aquarotter GmbH, downloaded Oct. 1, 2012.
Springking Industry Col, Limited, Touch Sensor Faucet, Product Specification, copyright 2010 downloaded Oct. 1, 2012.

* cited by examiner

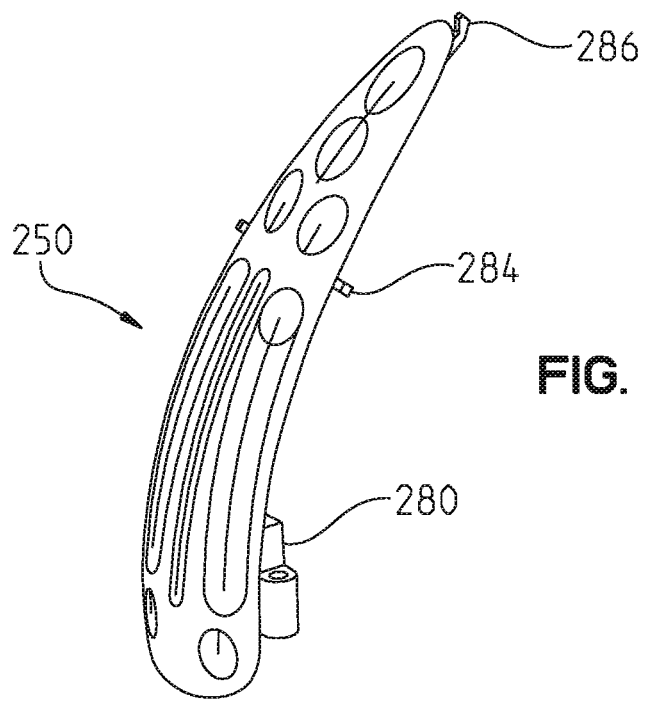
FIG. 15
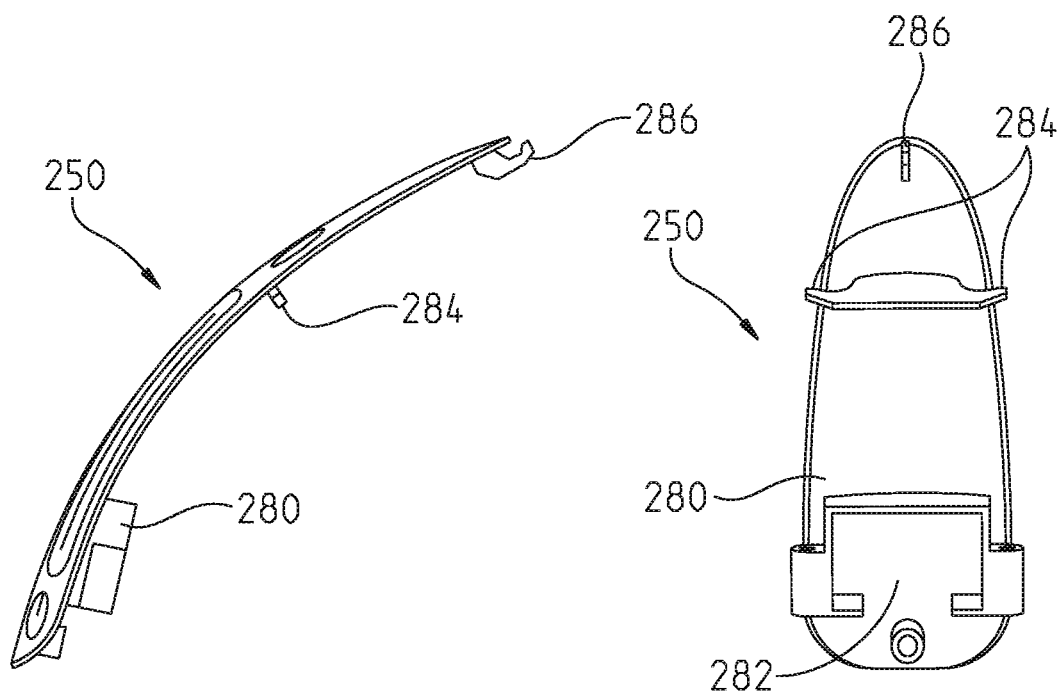
FIG. 16
FIG. 17

CAPACITIVE USER INTERFACE FOR A FAUCET AND METHOD OF FORMING

CROSS-REFERENCE TO RELATED APPLICATIONS

This application is a continuation-in-part of U.S. patent application Ser. No. 12/255,358, filed Oct. 21, 2008, which is a continuation-in-part of U.S. patent application Ser. No. 11/737,727, filed Apr. 19, 2007, now U.S. Pat. No. 8,162,236, which claims priority to U.S. Provisional Application Ser. No. 60/794,229, filed Apr. 20, 2006, and which is a continuation-in-part of U.S. patent application Ser. No. 11/700,556, filed Jan. 31, 2007, now U.S. Pat. No. 8,118,240, which claims priority to U.S. Provisional Application Ser. No. 60/794,229, filed Apr. 20, 2006, and this application further claims priority to U.S. Provisional Application Ser. No. 61/705,969, filed Sep. 26, 2012, the disclosures of which are expressly incorporated by reference herein.

BACKGROUND AND SUMMARY OF THE INVENTION

The present invention relates generally to user interfaces and, more particularly, to capacitive user interfaces for faucets.

Faucets have traditionally been controlled by a manual user input, such as a single handle which is coupled to a mixing valve to proportion the flow of hot and cold water to a delivery spout, or two handles which utilize two separate valves to control the flow of hot and cold water to a delivery spout. Typically, a user operates either the single handle or the two handles to regulate the flow of hot water and cold water, and hence both the flow rate and the temperature of an outlet mixed water. Additionally, electronic user interfaces are known to control actuation of one or more electrically operable valves to control the flow of mixed water through a delivery spout.

According to an illustrative embodiment of the present disclosure, an electronic user interface includes a thermally formed assembly of layers including a conductive layer, a graphics layer, and a protective layer. The conductive layer includes a plurality of conductive sensors supported by a polymeric film. The graphics layer includes a plurality of visual indicia supported by a polymeric film, the visual indicia aligned above the conductive sensors. The protective layer includes a polymeric film positioned above the graphics layer.

According to another illustrative embodiment of the present disclosure, a method of forming an electronic user interface includes the steps of providing a conductive layer, affixing a graphics layer on an upper surface of the conductive layer, affixing a protective layer on an upper surface of the graphics layer to define a bonded assembly, and thermally forming the bonded assembly in a plurality of dimensions to define a formed assembly.

According to a further illustrative embodiment of the present disclosure, an electronic user interface for a faucet includes a delivery spout having an outlet for supplying water. A thermally formed assembly of layers includes a conductive layer, a graphics layer, and a protective layer. The conductive layer includes a plurality of conductive sensors having a first user input configured to control a first characteristic of water through the outlet of the delivery spout, and a second user input configured to control a second characteristic of water through the outlet of the delivery spout. The graphics layer includes a plurality of visual indicia supported by a polymeric film. The protective layer includes a polymeric film positioned above the graphics layer. A structural support is formed of a polymer and molded to the rear of the conductive layer. The structural support is coupled to the delivery spout.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 15 is a perspective view of the final user interface with a polymer molded to the back of the formed layers;

FIG. 16 is a side elevational view of the user interface of FIG. 15; and

FIG. 17 is a rear view of the user interface of FIG. 15.

DETAILED DESCRIPTION OF THE DRAWINGS

The embodiments of the invention described herein are not intended to be exhaustive or to limit the invention to precise forms disclosed. Rather, the embodiments elected for description have been chosen to enable one skilled in the art to practice the invention. Although the disclosure is described in connection with water, it should be understood that additional types of fluids may be used.

Figure 1:
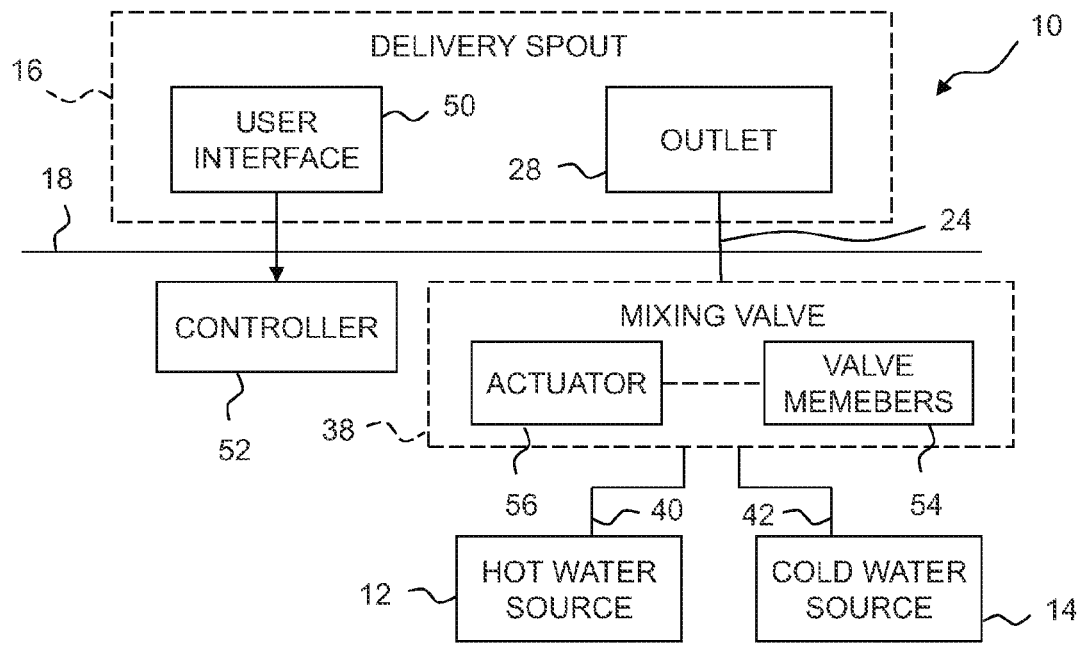
FIG. 1 is a diagrammatic representation of an illustrative embodiment water delivery device.

Referring initially to FIG. 1, a diagrammatic representation of a water delivery device 10 is shown. In the illustrative embodiment, the water delivery device 10 is fluidly coupled to a hot water source 12 and a cold water source 14. The water delivery device 10 illustratively includes a delivery spout 16 coupled to and supported above a mounting deck 18. Illustrative mounting decks 18 include a countertop, a sink top, a tub, a wall, and other suitable mounting structures.

Figure 2:
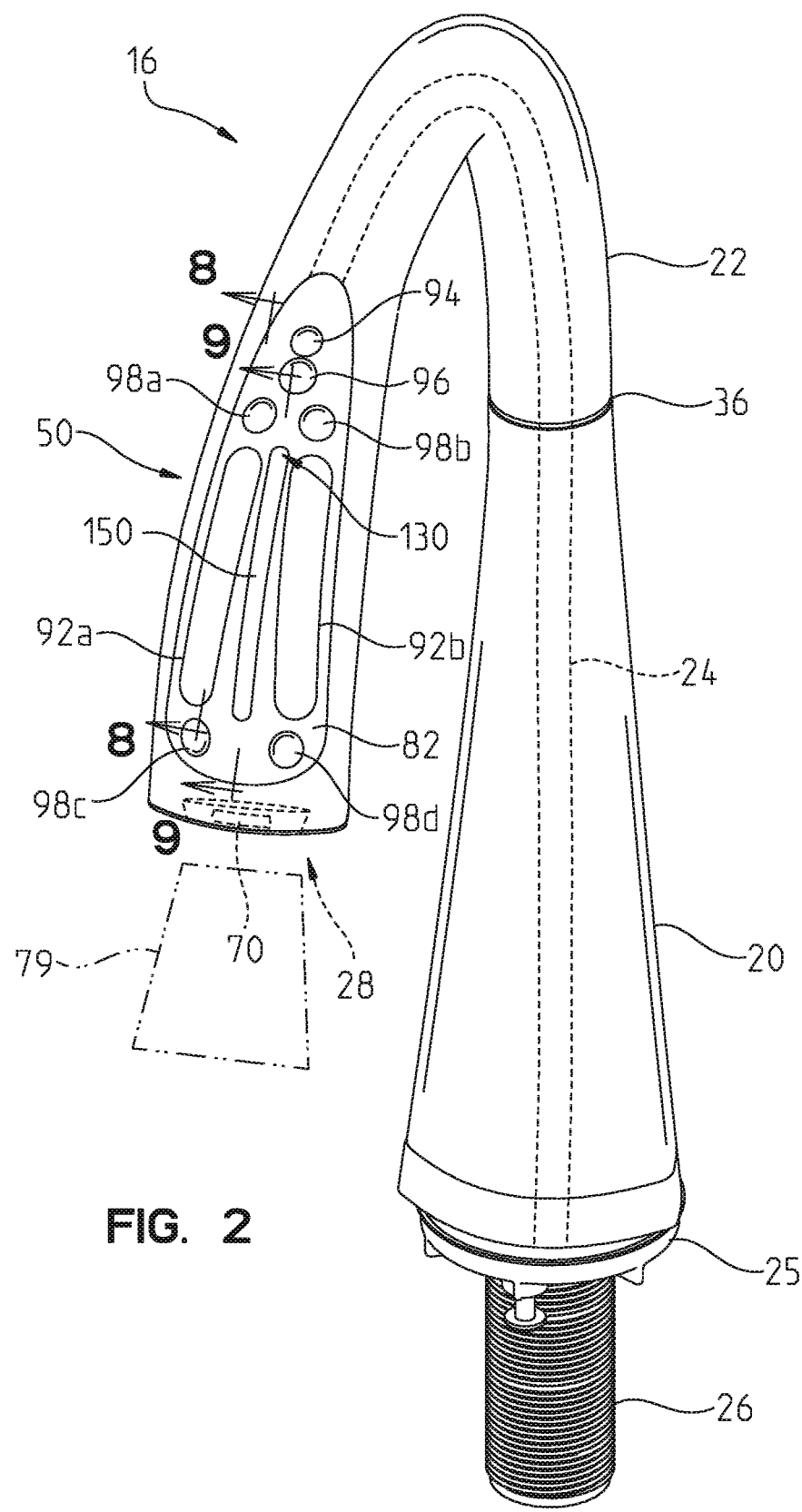
FIG. 2 is a perspective view of an illustrative embodiment delivery spout of a water delivery device of FIG. 1.
Figure 4:
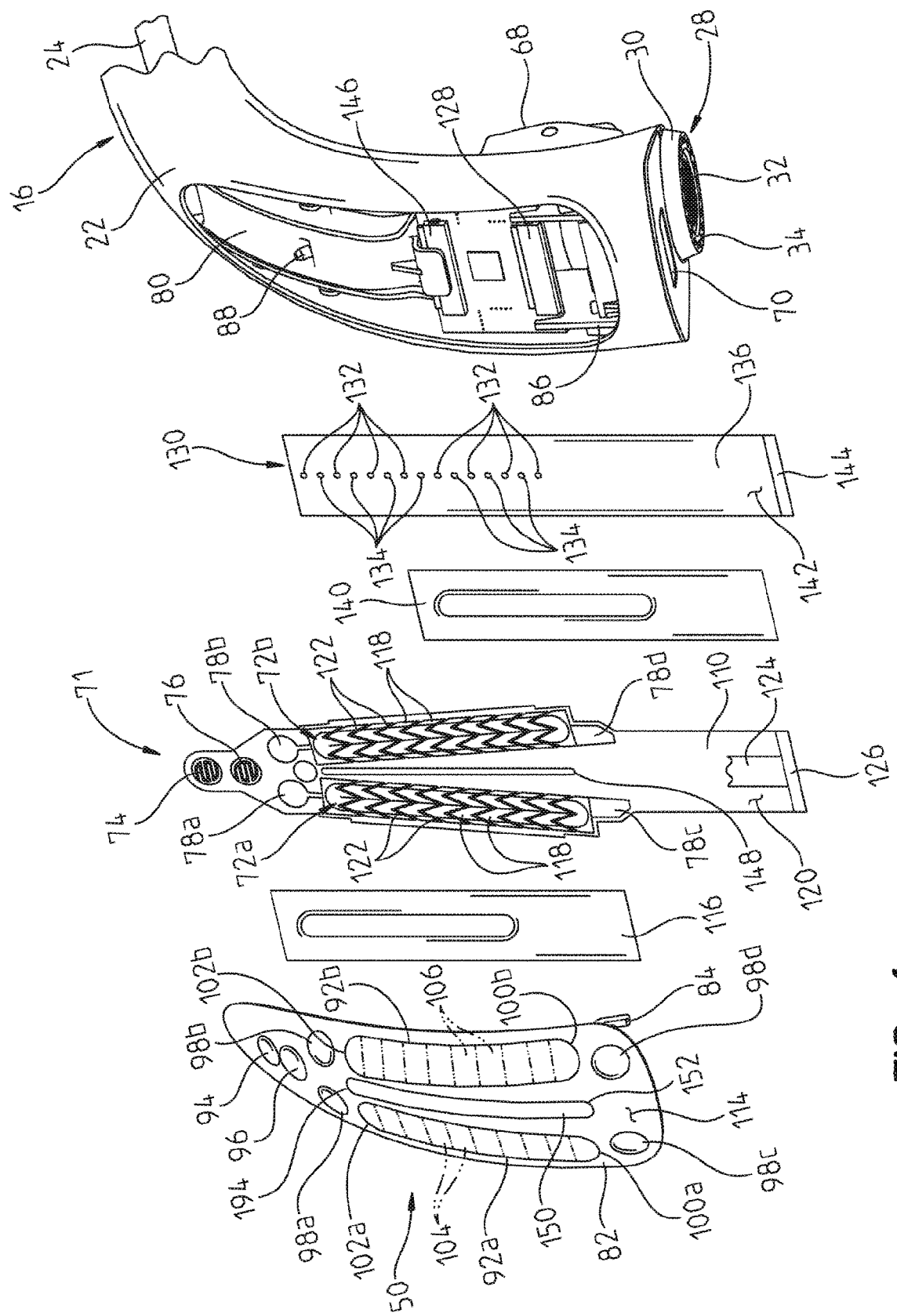
FIG. 4 is an exploded perspective view of the user interface of FIG. 2.

In one illustrative embodiment, the water delivery device 10 is a residential kitchen faucet and the mounting deck 18 is one of a countertop or sink. As shown in FIG. 2, the delivery spout 16 includes a base portion 20 and an outlet portion 22. Both the base portion 20 and the outlet portion 22 are tubular members defining a passageway extending therethrough for receiving at least one tubular waterway 24. The base portion 20 includes a coupler, such as a threaded nut 25 engaging a tubular mounting shank 26 for securing the delivery spout 16 to the mounting deck 18. The outlet portion 22 supports an outlet 28, illustratively in a spray head member 30 including a central output 32 and a second, surrounding output 34 (FIG. 4). In one illustrative embodiment, the outlet portion 22 may swivel or rotate relative to the base portion 20 about a swivel coupling 36. In a further illustrative embodiment, the outlet portion 22 may include a pull-out wand portion of the type disclosed in U.S. patent application Ser. No. 11/700,556, Publication No. 2007/0246564, titled "PULL-OUT WAND," the disclosure of which is expressly incorporated by reference herein.

Base portion 20 of the delivery spout 16 is coupled to the mounting deck 18, while the outlet portion 22 is supported by the base portion 20. In the illustrative embodiment, the waterway 24 extends through the delivery spout 16 and is in fluid communication with a mixing valve 38 (FIG. 1). The mixing valve 38 is in fluid communication with the hot water source 12 and the cold water source 14 through waterways 40 and 42, respectively. Based upon input provided by a user interface 50 to a controller 52, the mixing valve 38 regulates the temperature and/or flow rate of water supplied to the waterway 24 of delivery spout 16.

In the illustrative embodiment of FIG. 1, the mixing valve 38 provides water on/off control, water flow regulation, and water temperature regulation. In one illustrative embodiment, the mixing valve 38 is comprised of multiple valve members 54 coupled to at least one actuator 56 and which together provide on/off control, water flow regulation, and/or water temperature regulation. Exemplary valves are detailed in U.S. patent application Ser. No. 11/737,727, Publication No. 2007/0246550, titled "ELECTRONIC USER INTERFACE FOR ELECTRONIC MIXING OF WATER FOR RESIDENTIAL FAUCETS," the disclosure of which is expressly incorporated by reference herein. While the illustrated embodiment shows a single mixing valve 38, it should be appreciated that separate valves may be fluidly coupled to the hot water source 12 and the cold water source 14 to provide similar water on/off control, water flow regulation, and/or water temperature regulation. Illustrative valves are detailed in U.S. patent application Ser. No. 11/109,281, Publication No. 2006/0231638, titled "ELECTRONIC PROPORTIONING VALVE," the disclosure of which is expressly incorporated by reference herein.

Figure 3:
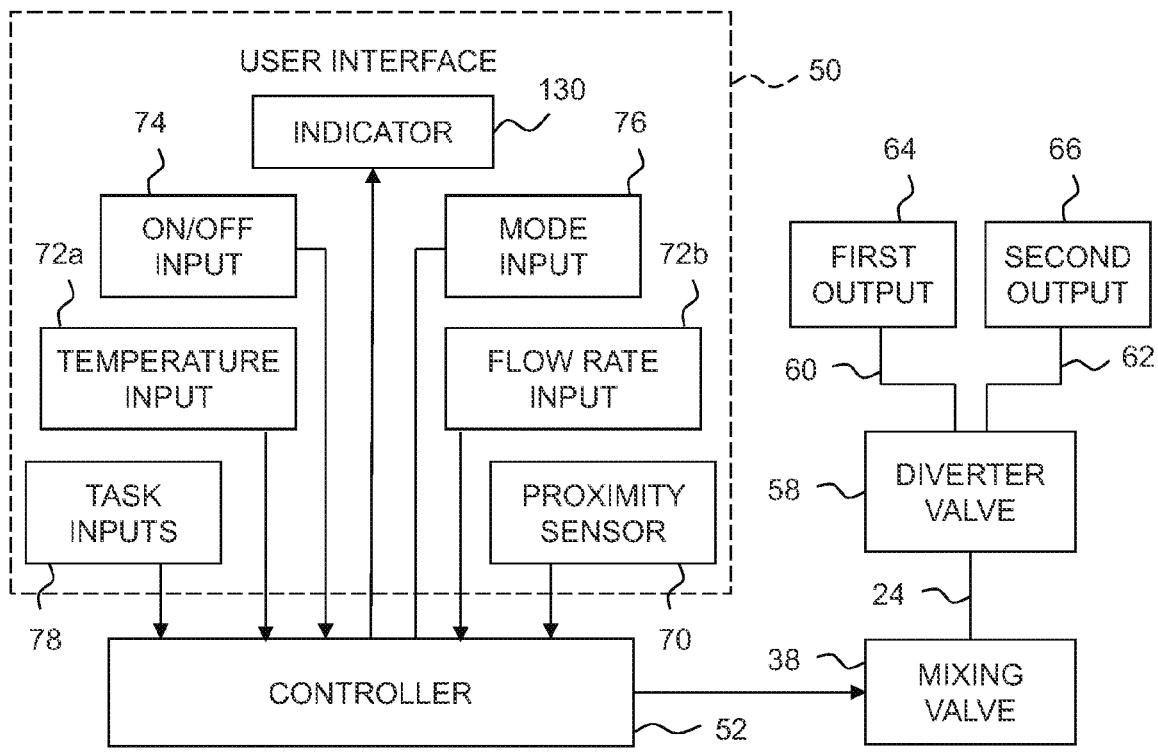
FIG. 3 is a diagrammatic representation of an illustrative user interface operably coupled to a controller for controlling the temperature and flow rate of water delivered by a mixing valve to a diverter valve.

The mixing valve 38 and the controller 52 are illustratively positioned on opposite sides of the mounting deck 18 as the base portion 20 and the outlet portion 22 of the delivery spout 16. In one illustrative embodiment, both the mixing valve 38 and the controller 52 are positioned on the same side of mounting deck 18 as the base portion 20. In a further illustrative embodiment, one or both of the mixing valve 38 and the controller 52 are incorporated into one of the base portion 20 and the outlet portion 22 of the delivery spout 16. In another illustrative embodiment, the controller 52 includes a first controller positioned in the outlet portion 22 of the delivery spout 16 and a second controller positioned in one of the base portion 20 and on an opposite side of the mounting deck 18. The first controller positioned in the outlet portion 22 interfaces with sensors included in the outlet portion 22, such as a temperature input 72a, a flow rate input 72b and/or a proximity sensor 70 (FIG. 3). The second controller positioned in the base portion 20 or on the opposite side of the mounting deck 18 interfaces with the mixing valve 38. The first controller and the second controller may be in communication with each other through either a wired or wireless connection. In a wireless connection, such as radio frequency (RF), the outlet portion 22 includes a battery to power the first controller.

Illustratively, the user interface 50 indirectly interacts with the mixing valve 38, such as by providing one or more inputs to the controller 52. Referring to FIG. 3, a diagrammatic representation of an illustrative embodiment of the user interface 50 is shown in communication with the controller 52 for controlling mixing valve 38. The mixing valve 38 may be in fluid communication with a diverter valve 58 via the waterway 24. Illustratively, the waterway 24 may be made of a cross-linked polyethylene (PEX) material. However, the waterway 24 and any of the additional waterways disclosed herein may be made of other materials, including metals or polymers. For example, waterway 24 may be formed of a polyethylene (PE), polypropylene (PP) or polybutylene (PB). It is further envisioned that the waterway 24 and any of the additional waterways disclosed herein could be formed of cross-linked polyvinylchloride (PVCX) using silene free radical initiators, from cross-linked polyurethane, or cross-linked propylene (XLPP) using peroxide or silene free radical initiators.

The diverter valve 58 is in fluid communication with two waterways 60 and 62 which are in fluid communication with a first output 64 and a second output 66, respectively, defined by the central output 32 and the surrounding output 34 of the spray head member 30 (FIG. 4). In one illustrative embodiment, the first output 64 defined by the central output 32 is configured to provide water in a stream configuration and the second output 66 defined by the surrounding output 34 is configured to provide water in a spray configuration.

As is known in the art, a diverter valve diverts the flow of a fluid from one of a plurality of potential fluid outlets based upon the configuration of the valve. By adjusting the configuration of the valve, the fluid outlet to which fluid is provided may be selected. Illustratively, the diverter valve 58 is a manual diverter valve including a rocker or toggle switch 68 (FIG. 4) configured to switch between the waterways 60 and 62 and the first and second outputs 64 and 66, respectively, in response to manual input from a user. The manual diverter valve 58 may be replaced with an electronically controller diverter valve, typically including a solenoid valve.

With further reference to FIG. 3, the user interface 50 includes a plurality of sensors operably coupled to the controller 52, through either a wired or wireless connection. In one illustrative embodiment, one or more of the sensors provide an indication of the presence of an object, such as a user's hands or other presentments, in a detection zone. Further, in an illustrative embodiment, one or more of the sensors detect the presence of touch by a user.

In the illustrative embodiment of FIGS. 3 and 4, the sensors include proximity sensor 70 and a plurality of touch sensors 72a, 72b, 74, 76, and 78. The proximity sensor 70 may be of conventional design as including an IR emitter which emits IR energy into a detection zone 79 and an IR detector which receives reflected IR energy from the detection zone 79 (FIG. 2). When an object, such as a user's hands, is detected in the detection zone 79, due to the amount of IR energy received by the IR detector, the proximity sensor 70 provides an indication thereof to the controller 52. In one illustrative embodiment, the controller 52 monitors a voltage corresponding to the IR level detected by the IR detector to determine whether user's hands are present in the detection zone 79. In another illustrative embodiment, the proximity sensor 70 is a capacitive proximity sensor. In one example, the range of the capacitive proximity sensor (i.e. detection zone 79) is about three inches from the outlet 28.

As further detailed herein, each touch sensor 72, 74, 76, 78 monitors a region of the user interface 50 supported by the outlet portion 22 and provides an indication to the controller 52 of a user touching that region. In one illustrative embodiment, touch sensors 72, 74, 76, 78 are capacitive sensors wherein the controller 52 monitors each capacitive touch sensor 72, 74, 76, 78 to determine when the user touches the region corresponding to the respective touch sensor 72, 74, 76, 78.

Referring now to FIGS. 2 and 4, illustrative user interface 50 is shown supported by the outlet portion 22 of the delivery spout 16. The user interface 50 includes a housing 80 received within the outlet portion 22 and supporting a removable cover 82. A lower end of the cover 82 includes a pair of hooks 84 which are coupled to anchors or pegs 86 of the housing 80. A fastener, such as a screw 88, may be used to couple the upper end of the cover 82 to the housing 80. The proximity sensor 70 is illustratively oriented downwardly from the housing 80. The spray head member 30 is fluidly coupled to the waterway 24 and may be removably docked with the bottom of the housing 80 in instances where the spray head member 30 forms part of a pull-out wand of the outlet portion 22. The spray head member 30 may be secured in a docked position through various means, such as a magnet or a bayonet coupling.

In one illustrative embodiment, the housing 80 and cover 82 are made of non-metallic material. Such illustrative non-metallic materials include polymers, for example thermoplastic or thermoset materials, such as polyesters, melamine, melamine urea, melamine phenolic, and phenolic.

As noted above, the proximity sensor 70 monitors detection zone 79 positioned on or below the end face of the outlet portion 22 of delivery spout 16. In one illustrative embodiment, the proximity sensor 70 is oriented to monitor a different detection zone 79, such as forward of, or forward and downward of, the outlet portion 22.

With further reference to FIGS. 3 and 4, the user interface 50 includes a touch sensor assembly 71 having a plurality of touch sensors 72a 72b, 74, 76, 78. Touch sensors 72a, 72b are slide sensors which monitor the position of a user's finger along a corresponding region 92a, 92b of the cover 82, respectively. Touch sensors 74, 76, 78a, 78b, 78c, 78d illustratively monitor regions 94, 96, 98a, 98b, 98c, 98d of cover 82, respectively.

Regions 92a, 92b associated with sensors 72a, 72b extend between opposing lower and upper ends 100a, 100b and 102a, 102b, respectively. A plurality of segments 104, 106 extend between the ends 100a, 100b and 102a, 102b of the regions 92a, 92b, respectively. While ten different segments 104, 106 are illustrated in FIG. 4 for each region 92a, 92b, it should be appreciated that the number may vary depending upon the application of the respective sensors 72a, 72b. Moreover, in certain embodiments, the regions 92a, 92b may be continuously variable between lower and upper ends 100a, 100b, and 102a, 102b.

A user may adjust the desired temperature by touching one of the segments 104 within region 92a associated with the sensor 72a. By touching a segment 104 closer to the lower end 100a, a lower temperature is selected, while touching a segment 104 closer to the upper end 102 selects a higher temperature. A user may simply touch a segment 104 of region 92a corresponding to the desired temperature, or may contact a different segment 104 and drag the finger to the segment 104 corresponding to the desired temperature.

A user may adjust the desired flow rate by touching one of the segments 106 within region 92b associated with the sensor 72b. By touching a segment 106 closer to the lower end 100b, a lower flow rate is selected. Similarly, by touching a segment 106 closer to the upper end 102b, a higher flow rate is selected. A user may simply touch a segment 106 of region 92b corresponding to the desired flow rate, or may contact a different segment 106 and drag the finger to the segment 106 corresponding to the desired flow rate. The selected temperature and flow rate from sensors 72a and 72b, respectively, are communicated to the controller 52 which adjusts mixing valve 38 to provide the desired temperature and flow rate.

Sensors 74, 76, and 78 illustratively have predefined functions defined by the controller 52. Illustratively, when a user touches the region 94 associated with sensor 74, the controller 52 either turns on (activates) or turns off (deactivates) the water flow through the outlet 28 by controlling mixing valve 38. Subsequent touches of region 94 successively deactivates and activates (i.e., toggles) the water flow through mixing valve 38. Further illustratively, when a user touches the region 96 associated with sensor 76, the controller 52 turns on (activates) and turns off (deactivates) the proximity sensor 70.

Sensors 78a, 78b, 78c, 78d and associated regions 98a, 98b, 98c, 98d define preset or task buttons that may permit a user to rapidly switch between different tasks, such as from a hot water task like washing pots and pans to a cold water task like obtaining drinking water. Illustratively, the user may make adjustments to the water characteristics defined by a preset by selecting a different temperature with region 92a and/or selecting a different flow rate with region 92b. In one illustrative embodiment, the task sensors 78a, 78b, 78c, 78d are adjustable by the user such that the user may provide customized characteristics for a given sensor 78a, 78b, 78c, 78d.

In one illustrative embodiment, the cover 82 may include indicia (not shown) to indicate to a user the location of the touch regions 92a, 92b, 94, 96, 98a, 98b, 98c, 98d and a function associated with each corresponding sensor 72a, 72b, 74, 76, 78a, 78b, 78c, 78d. The function corresponds to the actions taken by the controller 52 based on the detection of the touch by the user. Examples of input indicia and the corresponding action taken by the controller relative to a mixing valve and/or diverter valve are provided in U.S. patent application Ser. No. 11/737,727, Publication No. 2007/0246550, titled "ELECTRONIC USER INTERFACE FOR ELECTRONIC MIXING OF WATER FOR RESIDENTIAL FAUCETS," the disclosure of which is expressly incorporated by reference herein.

Figure 8:
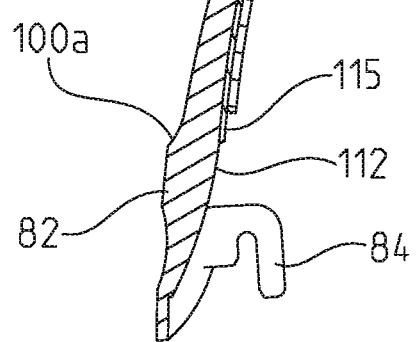
FIG. 8 is a cross-sectional view taken along line 8-8 of FIG. 2.

As stated above, the sensors 72a, 72b are illustratively slide touch sensors. As shown in FIGS. 4 and 8, sensors 72a and 72b are both illustratively supported on a common base member 110. Touch sensor 72b is substantially the same as touch sensor 72a. As such, the following discussion relative to touch sensor 72a is equally applicable to touch sensor 72b.

The base member 110 supporting sensors 72a and 72b is illustratively formed of an electrically insulating, flexible material, such as Mylar®. While the base member 110 in FIG. 4 is shown to be in a substantially planar configuration, upon assembly within the user interface 50, the base member 110 conforms to a non-linear profile similar to that shown in FIG. 8 by adhering to the curved inner surface 112 of the cover 82. The inner surface 112 illustratively follows the general curvature of the outer surface 114 of the cover 82 which, in turn, is configured to conform to the shape of the outlet portion 22 of the delivery spout 16. An adhesive member 116, such as a double-faced adhesive tape, is used to adhere the base member 110 to the inner surface 112 of the cover 82.

Figure 10:
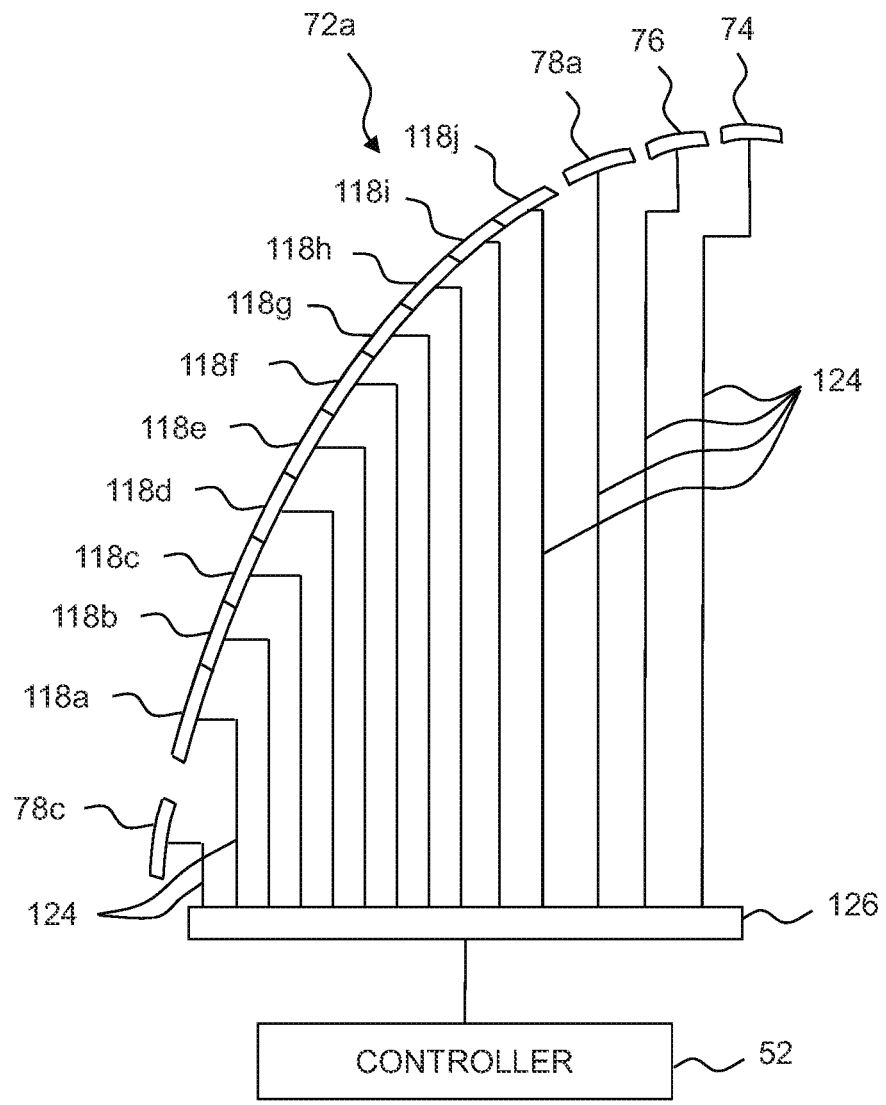
FIG. 10 is a schematic representation of the touch sensors of FIG. 4.

With reference to FIGS. 4 and 10, the touch sensor 72a includes a plurality of pads or contacts 118 that define the segments 104 of region 92a. The contacts 118 are illustratively formed by an electrically conductive material, such as copper applied to an outer surface 120 of the base member 110. Each contact 118 is electrically separated from an adjacent contact by a boundary 122. The boundaries 122 are illustratively formed in a saw tooth pattern such that a touch by a user bridging adjacent contacts 118 may be proportioned between such adjacent contacts 118. Illustratively, circuitry of controller 52 interpreting input from the sensors 72a, 72b may be manufactured by Cypress of San Jose, Calif.

The sensors 74, 76, and 78 are also illustratively formed by an electrically conductive material, such as copper, applied to the outer surface 120 of the base member 110. With reference to FIG. 10, traces or connecting paths 124 are also illustratively formed of an electrically conductive material, such as copper, and are electrically coupled to the contacts 118 of sensors 72a, 72b, and the sensors 74, 76, 78a, 78b, 78c, 78d. More particularly, the traces 124 provide electrical communication between the sensors 72a, 72b, 74, 76, 78a, 78b, 78c, 78d and a connector 126. The connector 126 is illustratively electrically coupled to a receptacle 128 within the housing 80 of the user interface 50 which, in turn, is electrically coupled to the controller 52.

With reference to FIGS. 3 and 4, indicator 130 is also provided within the user interface 50. More particularly, the indicator 130 includes a plurality of light sources 132 and 134, illustratively light emitting diodes (LEDs), supported on a base member 136, illustratively a printed circuit board. The base member 136 may be formed of an electrically insulating, flexible material, such as Mylar®.

Figure 9:
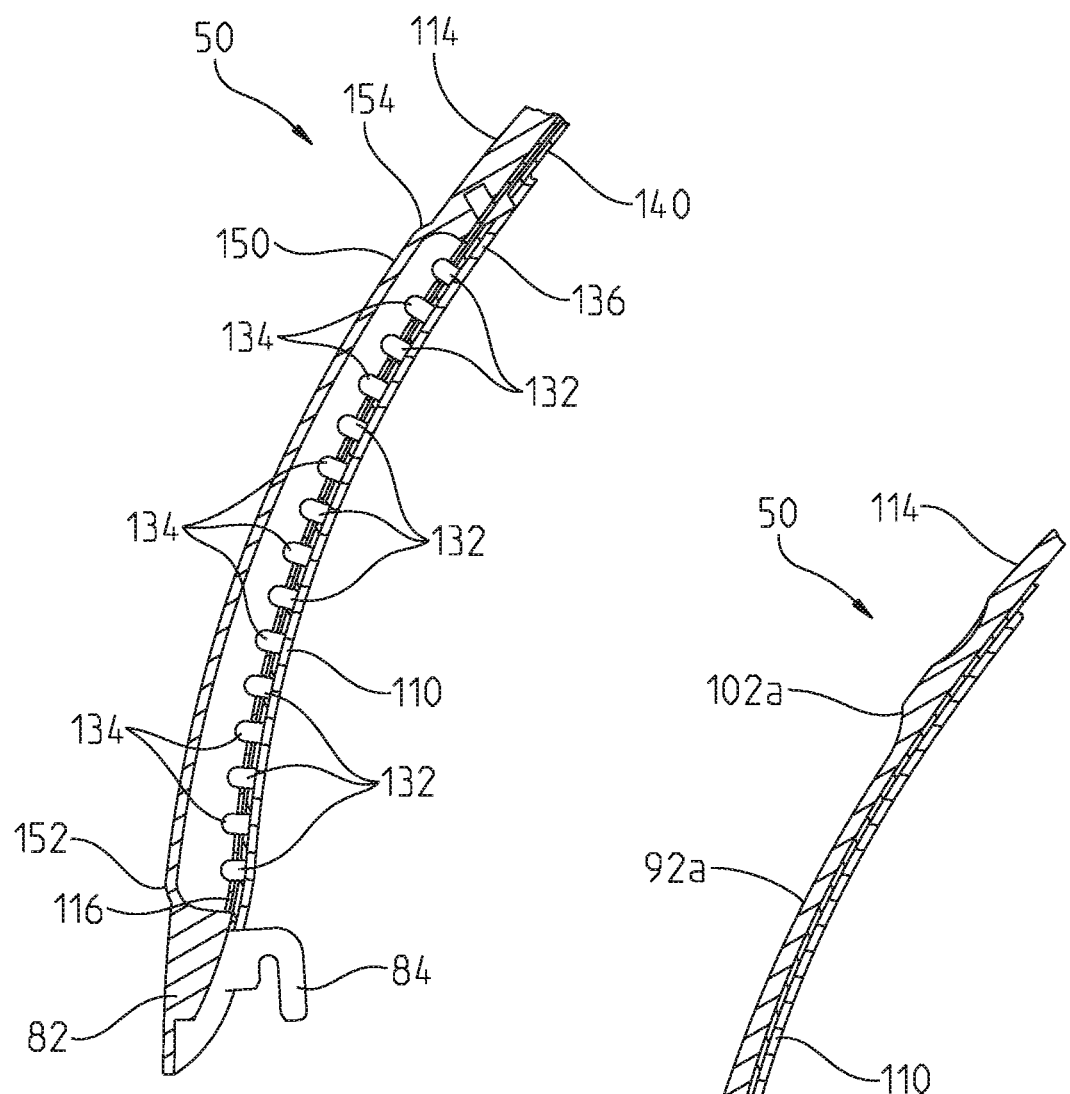
FIG. 9 is a cross-sectional view taken along line 9-9 of FIG. 2.

While the base member 136 in FIG. 4 is shown to be in a substantially planar configuration, upon assembly within the user interface 50, the base member 136 conforms to a non-linear profile similar to that shown in FIG. 9 by adhering to the curved inner surface 138 of the base member 110 of the touch sensor assembly 71. More particularly, an adhesive member 140, such as double-faced adhesive tape, is used to adhere the outer surface 142 of the base member 136 to the inner surface 138 of the base member 110. A connector 144 is illustratively in electrical communication with the light sources 132, 134. The connector 144 is configured to be electrically coupled to a receptacle 146 within the user interface 50 (FIG. 4) which, in turn, is electrically coupled to the controller 52.

In one illustrative embodiment, the light sources 132 and 134 are surface mount LEDs available from Liteon of Milpitas, Calif. The LEDs 132, 134 are illustratively received within a slot 148 formed within the base member 110 of the touch sensor assembly 71. A window 150 is formed within the cover 82 and extends between lower and upper ends 152 and 154. The window 150 permits light generated by the indicator 130 to be visible from the exterior of the cover 82. Illustratively, the indicator 130 indicates a selected parameter of one or both of the sensors 72a, 72b. In one illustrative embodiment, the indicator 130 displays a current value of the parameter controlled by the input to sensor 72a. In a further illustrative embodiment, the indicator 130 indicates a current value of the parameter controlled by sensor 72b. In yet another illustrative embodiment, as further detailed herein, the indicator 130 indicates current values of the parameters controlled by both sensors 72a and 72b.

As shown in the illustrative embodiment of FIG. 4, the LEDs 132 are interspaced with the LEDs 134. Illustratively, LEDs 132 are configured to emit a blue color, while LEDs 134 are configured to emit a red color. By varying the number of blue LEDs 132 illuminated relative to the number of red LEDs 134 illuminated, the displayed color changes. As further detailed below, the ratio of LEDs 132 illuminated relative to LEDs 134 (i.e., color) indicates the value of the parameter (e.g. temperature) controlled by sensor 72a, while the total number of combined LEDs 132 and 134 illuminated (i.e., magnitude or light level) indicates the value of the parameter (e.g. flow rate) controlled by sensor 72b.

While longitudinally-spaced apart blue and red LEDs 132 and 134 are illustrated, it should be appreciated that variations may be substituted therefor. For example, each blue LED 132 may be spaced laterally adjacent a red LED 134, wherein a plurality of these laterally spaced combinations of blue and red LEDs 132 and 134 are longitudinally spaced apart from each other. In yet another illustrative embodiment, separate blue and red LEDs 132 and 134 may be replaced by a plurality of bi-color LEDs.

Figure 7:
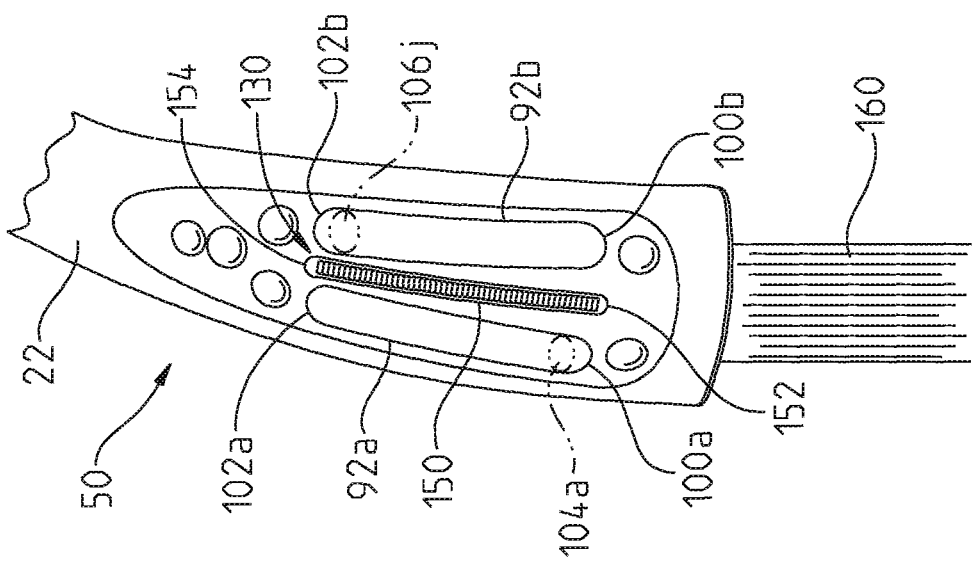
FIG. 7 is a perspective view of the user interface similar to FIG. 5, showing a full cold temperature selection at the first touch slider user input, a full flow selection of the second touch slider user input, and a corresponding visual indication by the indicator.
Figure 6:
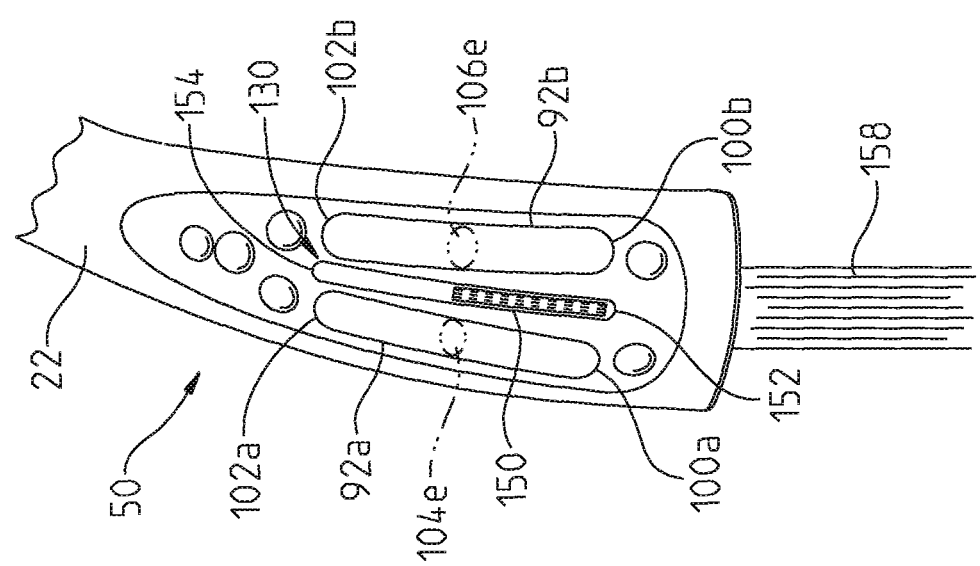
FIG. 6 is a perspective view of the user input similar to FIG. 5, showing a mixed temperature selection at the first touch slider user input, a medium flow selection at the second touch slider user input, and a corresponding visual indication by the indicator.
Figure 5:
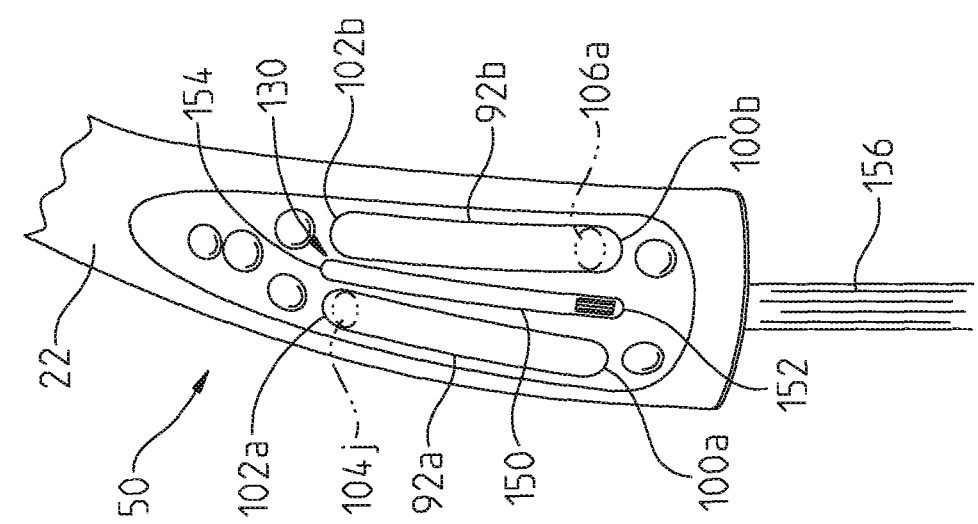
FIG. 5 is a perspective view of the user interface of FIG. 2, showing a full hot temperature selection at the first touch slider user input, a low flow selection of the second touch slider user input, and a corresponding visual indication by the indicator.

In the illustrative embodiment as shown in FIGS. 5-7, the indicator 130 provides a combined indication of parameters (e.g. temperature and flow rate) controlled by both sensors 72a and 72b through user input to regions 92a and 92b, respectively. In the illustrative embodiment detailed herein, input to region 92a and first sensor 72a controls temperature, while input to region 92b and second sensor 72b controls flow rate.

A hot water, low flow condition is represented by the indicator 130 in FIG. 5. More particularly, a user contacts segment 104j of region 92a corresponding to contact 118j of sensor 72a, thereby instructing the controller 52 that the greatest value of the applicable parameter (i.e., temperature) is requested. When a user contacts segment 106a of region 92b corresponding to contact 118a of sensor 72b, the controller 52 is instructed that the lowest value of the applicable parameter (i.e., flow rate) is requested (represented by water stream 156 in FIG. 5). The controller 52 instructs the mixing valve 38 to operate at a hot water, low flow condition. This is indicated to the user by the controller 52 causing the indicator 130 to illuminate only red LEDs 132 with a low magnitude of light displayed. In other words the indicator 130 displays red LEDs with a low height level (i.e. close to lower end 152) within window 150.

A warm water, medium flow condition is represented by the indicator 130 in FIG. 6. More particularly, a user contacts segment 104e of region 92a corresponding to contact 118e of sensor 72, thereby instructing the controller 52 that a value of the applicable parameter (i.e. temperature) proportioned between ends 100a and 102a is requested. In this instance, contact 118e is the fifth contact from end 102a out of a total of ten contacts 118 such that the desired temperature is 50% of the maximum value of sensor 118j at end 100a. Similarly, the user contacts segment 106e of region 92b corresponding to contact 118e of sensor 72b, thereby instructing the controller 52 that a value of the applicable parameter (i.e., flow rate)

proportioned between ends 100b and 102b is requested. Again, contact 118e is illustratively the fifth contact out of ten total contacts such that the desired flow rate is 50% of the maximum value of sensor 118j at end 100b (represented by water stream 158 in FIG. 6). The controller 52 instructs the mixing valve 38 to operate at this warm water, medium flow condition. This 50/50 hot/cold mixed water, 50% flow rate condition is indicated by indicator 130 by illuminating an equal ratio of blue LEDs 132 and red LEDs 134 (to display temperature as a purple color) and half of the total number of total LEDs 132 and 134 (to display half of the distance or height between the bottom and top 152 and 154 of the window 150).

A cold water, full flow condition is represented by the indicator 130 in FIG. 7. More particularly, a user contacts segment 104a of region 92a which corresponds to contact 118a of sensor 72a, thereby instructing the controller 52 that a maximum value of the applicable parameter (i.e., temperature) is desired. Similarly, the user contacts segment 106j of region 92b which corresponds to contact 118j of sensor 82b, thereby instructing the controller 52 that a maximum value of the applicable parameter (i.e., flow rate) is desired (represented by water stream 160 in FIG. 7). The controller 52 instructs the mixing valve 38 to operate at this cold water, full flow condition. The indicator 130, in turn, is directed by the controller 52 to illuminate only blue LEDs 132 (to display temperature) and all blue LEDs 132 (to display full height of LEDs 132 proximate the top 154 of window 150).

Figure 11:
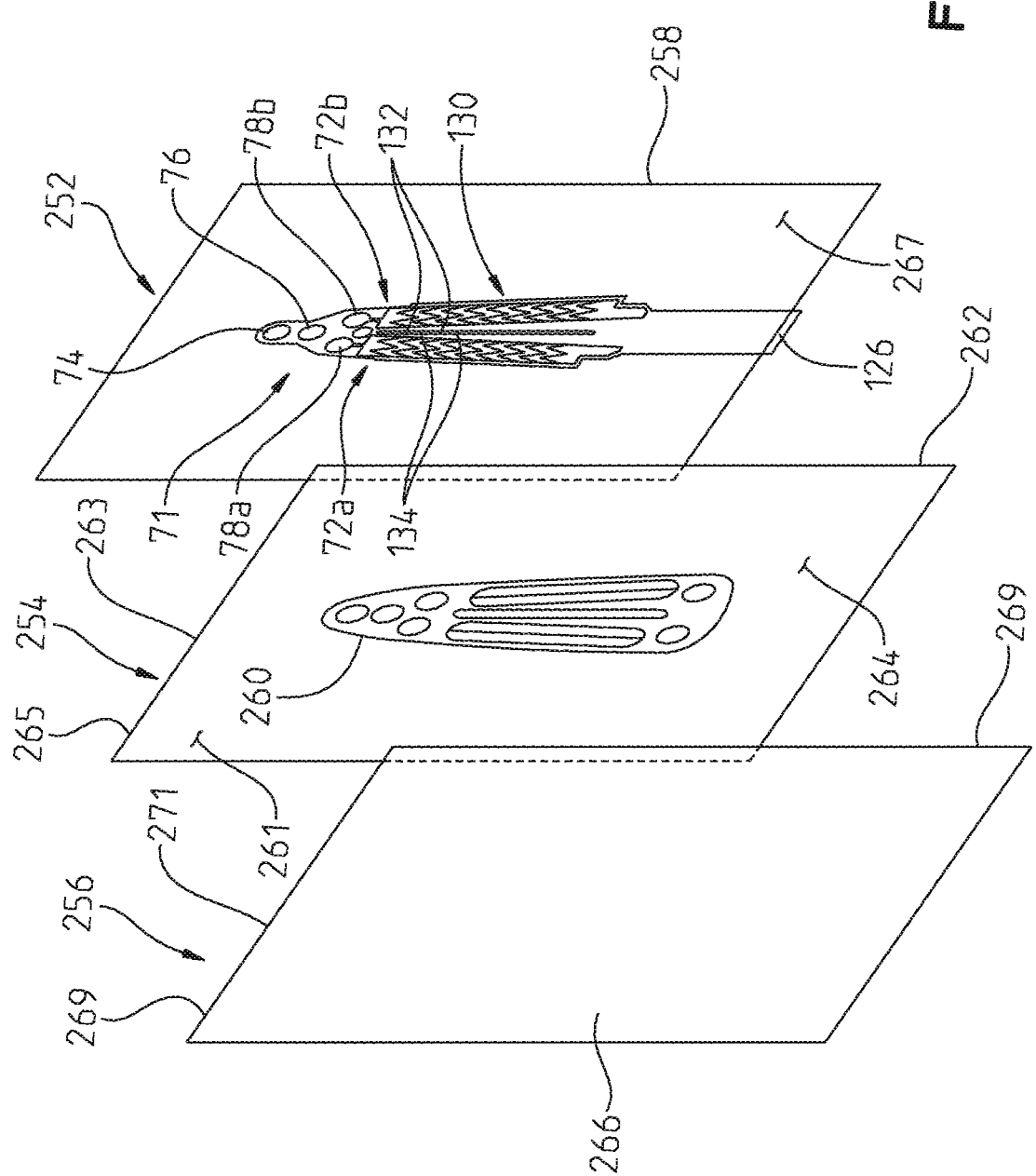
FIG. 11 is an exploded perspective view of an illustrative user interface, showing a plurality of layers prior to forming.

Referring now to FIG. 11, an illustrative user interface 250 may be thermally formed to produce a three-dimensional shape substantially matching the external contour and form of the spout 16. More particularly, the user interface 250 illustratively includes a conductive layer 252, a graphics layer 254, and a protective layer 256 formed into a three dimensional shape to provide a uniform appearance to the exterior of the spout 16.

The conductive layer 252 may include the sensor assembly 71 and the indicator 130 as detailed above in connection with FIG. 4. More particularly, the sensor assembly 71 and the indicator 130 may be adhered to a support layer 258, illustratively a flat polymeric film (e.g., acrylonitrile butadiene styrene (ABS)), for precise placement with respect to graphics 260 of the user interface 250. The sensor assembly 71 and the indicator 130 may include features detailed above. For example, the sensor assembly 71 may include copper or other conductive material used for conductive pads and traces, illustratively including capacitive input buttons 74, 76, 78 and/or sliders 72a, 72b. The indicator 130 may include light sources 132 and 134 (FIGS. 4 and 11), such as LEDs, to provide user feedback, such as water temperature, flow rate, operational mode, or confirm button press. A connector 126, illustratively a ribbon cable attachment, may electrically couple the conductive layer 252 to controller 52, such as a printed circuit assembly (PCA).

The graphics layer 254 illustratively includes a support layer 262 formed from a thin polymeric film (e.g., acrylonitrile butadiene styrene (ABS)) and may include a base or substrate 264 having a background color matched to the finish of the spout 16, including metallic finishes. The support layer 262 is illustratively electrically non-conductive to prevent electrical grounding or shielding of the conductive layer 252 (e.g., conductive pads and traces). This film 262 may be silk screened to include graphics 260, illustratively indicia such as lettering or additional colors to indicate button functions, logos or any other graphical information. The graphics 260 may be clear or semi-transparent, metallic or of other colors allowing for light sources (e.g., light emitting diodes (LEDs)) to illuminate therethrough. The graphics 260 may be applied to the film 262 in any conventional manner, such as ink printing. In other words, LEDs 132 and 134 supported by the conductive layer 252 may provide back illumination to the graphics 260. The graphics 260 may be applied to front and/or rear surfaces 261 and 263 of the support layer 262. If support layer 262 is translucent (but not transparent), then graphics 260 applied to the rear surface of the support layer 262 will typically be visible to the user only when illuminated from behind. Alternatively, graphics 260 applied to the front surface of the support layer 262 may be visible regardless of back illumination. The graphics layer 254 is illustratively adhesive backed (e.g., rear surface 263 includes a pressure sensitive adhesive 265) and adhered to a front surface 267 of the capacitive layer 252.

In another illustrative embodiment, the graphics layer 254 may be formed from a flexible electronic display screen (e.g., a flexible plastic e-paper display). More particularly, the screen may display variable graphics 260 to the user as provided by the controller 52.

The protective layer 256 illustratively includes a support layer 266 formed of a thin polymeric film (e.g., acrylonitrile butadiene styrene (ABS)). Illustratively, the protective layer 256 is adhesive backed (e.g., rear surface 269 includes a pressure sensitive adhesive 271) and adhered to front surface 261 of the graphics layer 254. The protective layer 256 provides chemical and physical protection to the graphics layer 254 and may add an appearance of depth to the graphics 260.

Figure 12:
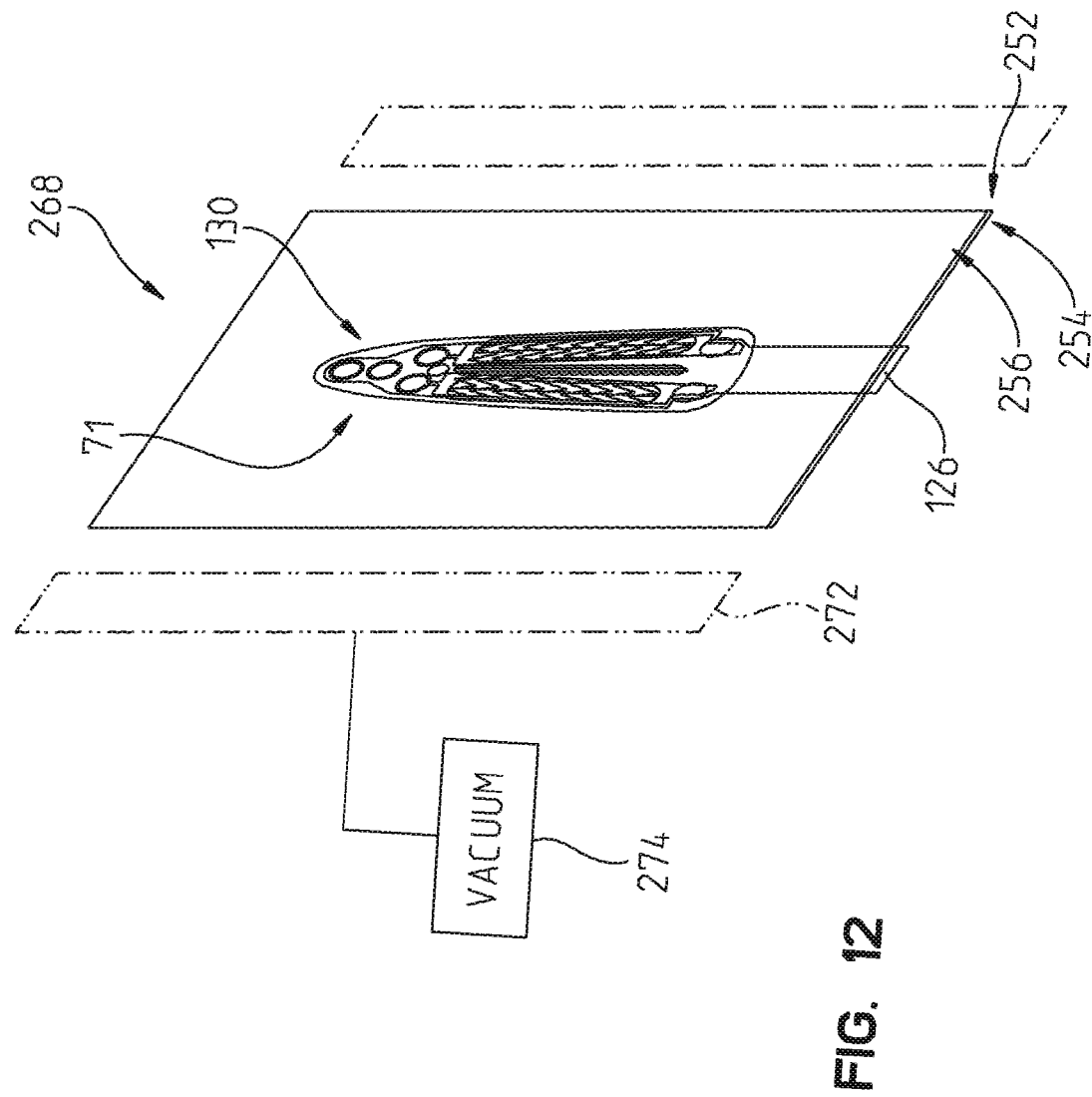
FIG. 12 is a perspective view of the user interface of FIG. 11, showing the plurality of layers bonded together, thereby defining a stacked or bonded assembly.

The bonded assembly 268 formed by affixing the graphics layer 254 to the conductive layer 252, and by affixing the protective layer 256 to the graphics layer 254, is shown in FIG. 12. More particularly, the conductive layer 252, the graphics layer 254, and the protective layer 256 are initially adhered together in the manner detailed above, illustratively through pressure sensitive adhesives 265 and 271 on the rear surfaces 263 and 269 of the graphics layer 254 and the protective layer 256, respectively. The layers 252, 254 and 256 are then rolled flat together to prevent air bubbles forming between the various layers. More particularly, the bonded assembly 268 may be passed between a pair of rollers (not shown). The graphics 260 may be directly positioned over and aligned with the appropriate conductive pads, e.g. input buttons 72a, 72b, 74, 76, 78. Ribbon cable 126 from the conductive layer 252 is folded out of the way and not adhered to the graphic layer 254.

Figure 13:
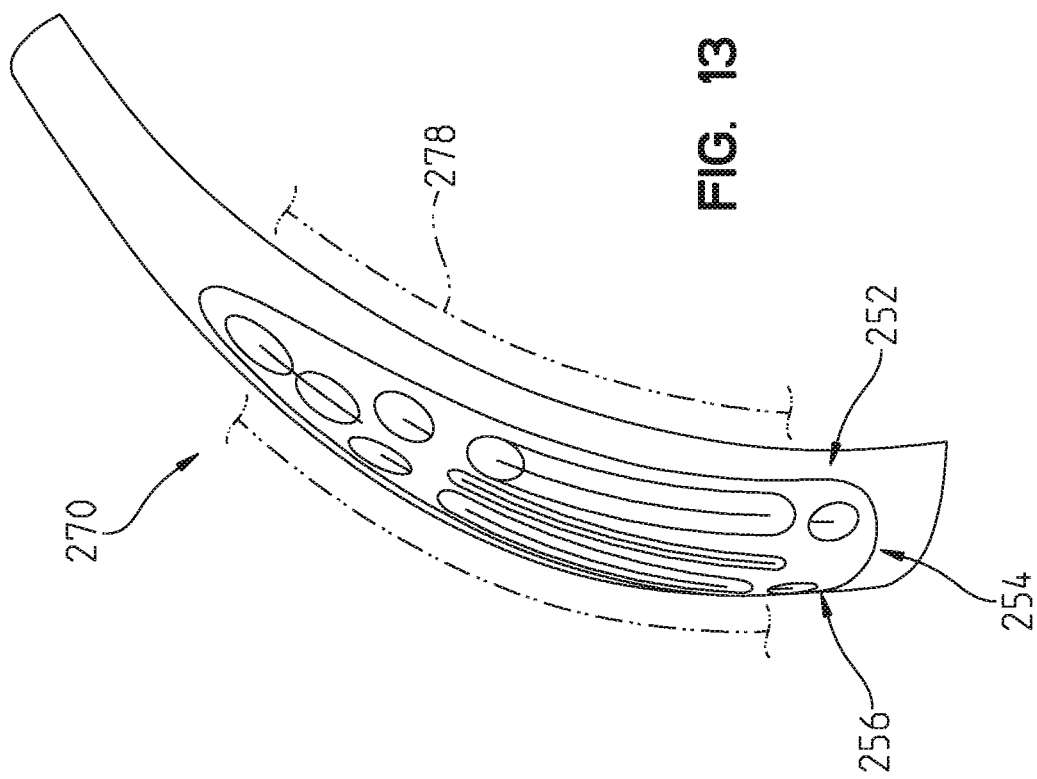
FIG. 13 is a perspective view of the bonded layers of FIG. 12, showing the layers of the bonded assembly formed into a desired shape, thereby defining a formed assembly.

Next, the bonded assembly 268 is thermally formed into a formed assembly 270 as shown in FIG. 13. More particularly, the layers 252, 254, and 256 of the bonded assembly 268 are heated and vacuum formed into an approximate final shape, thereby defining the formed assembly 270. In one illustrative embodiment, the layers 252, 254, and 256 are illustratively placed within a heated mold 272 defining the desired shape, and a vacuum 274 is applied to thermally form the assembly 268 into the proximate external shape of the spout 16. The resulting formed assembly 270 is curved in multiple directions to define a three dimensional (3D) shape.

Figure 14:
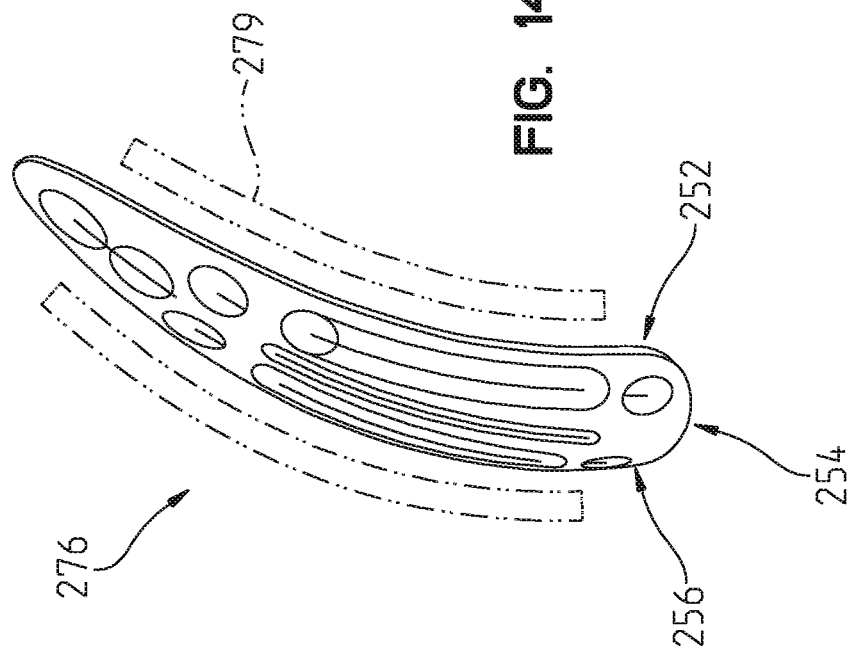
FIG. 14 is a perspective view showing the layers of the formed assembly of FIG. 13 trimmed to final desired size, thereby defining a punched or trimmed assembly.

The layers 252, 254, and 256 of the formed assembly 270 are then trimmed to define a trimmed or punched assembly 276 as shown in FIG. 14. The trimming is illustratively accomplished by placing the formed assembly 270 within a die assembly 278, wherein the die punches the assembly 270 to the final user interface size.

Next, the formed assembly is placed within a mold 279 where a polymer, illustratively a thermoplastic, is molded to the back of the trimmed assembly 276 to form a mounting member 280 and thereby defining the final user interface 250. The additional structural plastic of the mounting member 280 allows for the assembly to be securely mounted in the spout 16 without requiring other adhesives or fasteners between the structural part and the cosmetic/capacitive parts that are difficult to manufacture and could separate over time. A back pocket 282 is also formed in the mounting member to accept a PCA that may be plugged into the ribbon cable 126 (from the conductive layer) and potted (for example, through an epoxy) to form a water tight assembly. Other mounting features, such as tabs 284 and hook 286 may be defined by mounting member 280 to coupled with the spout 16.

The coupling of the conductive layer 252 to the graphics layer 254 allows for precise placement of the graphics 260 of the user interface 250. The flexible circuit 71 within the film 258 allows for the user interface 250 to conform to the shape of the spout 16 and allows for an equal distance from the outside of the user interface 250 (where the user will touch) to the capacitive pads. This is required for a properly working capacitive interface. The additional structural plastic of the mounting member 280 allows for the user interface 250 to be securely mounted in the spout 16.

Although the invention has been described in detail with reference to certain preferred embodiments, variations and modifications exist within the spirit and scope of the invention as described and defined in the following claims.

The invention claimed is:

1. An electronic user interface for a faucet comprising:
a thermally formed assembly of layers including a conductive layer, a graphics layer, and a protective layer, wherein:
the conductive layer includes a plurality of conductive sensors supported by a polymeric film;
the graphics layer includes a plurality of visual indicia supported by a polymeric film, the visual indicia aligned above the conductive sensors; and
the protective layer includes a polymeric film positioned above the graphics layer;
wherein the plurality of conductive sensors includes a first user input configured to control a first characteristic of water through the faucet, and a second user input configured to control a second characteristic of water through the faucet, the first user input comprising a first touch sensor to control a flow rate of water, and the second user input comprising a second touch sensor to control a temperature of water;
the first touch sensor including a plurality of electrically conductive contacts defining a plurality of segments extending between opposing lower and upper ends, wherein touching a segment of the first touch sensor proximate the lower end selects a lower flow rate of water, and touching a segment of the first touch sensor proximate the upper end selects a higher flow rate of water;
the second touch sensor including a plurality of electrically conductive contacts defining a plurality of segments extending between opposing lower and upper ends, wherein touching a segment of the second touch sensor proximate the lower end selects a lower temperature of water, and touching a segment of the second touch sensor proximate the upper end selects a higher temperature of water; and
a structural support formed of a polymer and molded to the rear of the conductive layer, wherein the structural support is configured to couple the electronic user interface in a faucet spout.

2. The electronic user interface of claim 1, wherein the visual indicia includes at least one of a letter, a number, and a color.

3. The electronic user interface of claim 1, wherein the conductive layer includes a light source, and the visual indicia are supported by a rear surface of the graphics layer for back illumination by the light source.

4. The electronic user interface of claim 1, wherein the layers are thermally formed into a three dimensional shape, wherein the shape is curved in multiple directions.

5. An electronic user interface for a faucet comprising:
a thermally formed assembly of layers including a conductive layer, a graphics layer, and a protective layer, wherein:
the conductive layer includes a plurality of conductive sensors supported by a polymeric film;
the graphics layer includes a plurality of visual indicia supported by a polymeric film, the visual indicia aligned above the conductive sensors; and
the protective layer includes a polymeric film positioned above the graphics layer;
wherein the plurality of conductive sensors includes a first user input configured to control a first characteristic of water through the faucet, and a second user input configured to control a second characteristic of water through the faucet; and
a structural support formed of a polymer and molded to the rear of the conductive layer, wherein the structural support is configured to couple the electronic user interface in a faucet spout;
wherein the first user input comprises a first touch slider to control a flow rate of water, and the second user input comprises a second touch slider to control a temperature of water.

6. An electronic user interface for a faucet comprising:
a delivery spout including an outlet for supplying water;
a thermally formed assembly of layers including a conductive layer, a graphics layer, and a protective layer, wherein:
the conductive layer includes a plurality of conductive sensors supported by a polymeric film, wherein the plurality of conductive sensors includes a first user input configured to control a first characteristic of water through the outlet of the delivery spout, and a second user input configured to control a second characteristic of water through the delivery spout;
the graphics layer includes a plurality of visual indicia supported by a polymeric film;
the protective layer includes a polymeric film positioned above the graphics layer, wherein the layers are thermally formed into a three dimensional shape, wherein the shape is curved in multiple directions; and
a structural support formed of a polymer and molded to the rear of the conductive layer, the structural support being coupled to the delivery spout;
wherein the first user input comprises a first touch slider to control a flow rate of water, and the second user input comprises a second touch slider to control a temperature of water.

7. The electronic user interface of claim 1, wherein the structural support is formed of a thermoplastic.

8. The electronic user interface of claim 1, wherein the structural support comprises a back pocket configured to accept a printed circuit assembly that is plugged into a ribbon cable of the conductive layer.

9. The electronic user interface of claim 1, wherein the structural support comprises a tab and a hook to couple the electronic user interface to the faucet spout.

* * * * *